United States Patent
Sasaki et al.

(10) Patent No.: US 8,513,034 B2
(45) Date of Patent: *Aug. 20, 2013

(54) METHOD OF MANUFACTURING LAYERED CHIP PACKAGE

(75) Inventors: Yoshitaka Sasaki, Milpitas, CA (US); Hiroyuki Ito, Milpitas, CA (US); Tatsuya Harada, Tokyo (JP); Nobuyuki Okuzawa, Tokyo (JP); Satoru Sueki, Tokyo (JP); Hiroshi Ikejima, Hong Kong (CN)

(73) Assignees: Headway Technologies, Inc., Milpitas, CA (US); TDK Corporation, Tokyo (JP); SAE Magnetics (H.K.) Ltd., Hong Kong (CN)

(*) Notice: Subject to any disclaimer, the term of this patent is extended or adjusted under 35 U.S.C. 154(b) by 237 days.

This patent is subject to a terminal disclaimer.

(21) Appl. No.: 13/064,880

(22) Filed: Apr. 22, 2011

(65) Prior Publication Data
US 2011/0201137 A1  Aug. 18, 2011

Related U.S. Application Data

(62) Division of application No. 12/222,955, filed on Aug. 20, 2008, now Pat. No. 7,964,976.

(51) Int. Cl.
*H01L 21/66* (2006.01)

(52) U.S. Cl.
USPC ........... 438/15; 438/14; 438/109; 257/691; 257/E25.013; 257/E25.018; 257/E21.522; 257/E21.523; 257/E21.526

(58) Field of Classification Search
USPC .......... 257/691, E25.013, E25.018, E21.522, 257/E21.523, E21.526; 438/14, 15, 109
See application file for complete search history.

(56) References Cited

U.S. PATENT DOCUMENTS

| | | | |
|---|---|---|---|
| 5,567,654 A | 10/1996 | Beilstein et al. | |
| 5,953,588 A | 9/1999 | Camien et al. | |
| 7,127,807 B2 | 10/2006 | Yamaguchi et al. | |
| 7,968,374 B2 * | 6/2011 | Sasaki et al. | 438/109 |
| 2002/0096760 A1 | 7/2002 | Simelgor et al. | |
| 2005/0098871 A1 * | 5/2005 | Fuergut et al. | 257/690 |
| 2007/0165461 A1 | 7/2007 | Cornwell et al. | |

OTHER PUBLICATIONS

Gann, Keith D., "Neo-Stacking Technology", *HDI Magazine*, Dec. 1999.

(Continued)

*Primary Examiner* — Bradley K Smith
*Assistant Examiner* — Maria Ligai
(74) *Attorney, Agent, or Firm* — Oliff & Berridge, PLC

(57) ABSTRACT

A method of manufacturing a layered chip package that includes a main body, and wiring disposed on a side surface of the main body. The main body includes a plurality of layer portions. The method includes fabricating a plurality of substructures, and completing the layered chip package by fabricating the main body using the plurality of substructures and by forming the wiring on the main body. Each substructure is fabricated through the steps of: fabricating a pre-substructure wafer including a plurality of pre-semiconductor-chip portions aligned; distinguishing between a normally functioning pre-semiconductor-chip portion and a malfunctioning pre-semiconductor-chip portion among the plurality of pre-semiconductor-chip portions included in the pre-substructure wafer; and forming electrodes connected to the normally functioning pre-semiconductor-chip portion and having respective end faces located in the side surface of the main body on which the wiring is disposed, without forming any electrode connected to the malfunctioning pre-semiconductor-chip portion.

10 Claims, 34 Drawing Sheets

(56) References Cited

OTHER PUBLICATIONS

U.S. Appl. No. 11/878,282, filed Jul. 23, 2007 in the name of Sasaki et al.
U.S. Appl. No. 11/896,709, filed Sep. 5, 2007 in the name of Sasaki et al.
U.S. Appl. No. 12/213,645, filed Jun. 23, 2008 in the name of Sasaki et al.
U.S. Appl. No. 12/216,143, filed Jun. 30, 2008 in the name of Sasaki et al.
U.S. Appl. No. 12/216,168, filed Jun. 30, 2008 in the name of Sasaki et al.

* cited by examiner

METHOD OF MANUFACTURING LAYERED CHIP PACKAGE

This is a Divisional of U.S. patent application Ser. No. 12/222,955 filed Aug. 20, 2008. The disclosure of the prior application is incorporated herein by reference in its entirety.

BACKGROUND OF THE INVENTION

1. Field of the Invention

The present invention relates to a layered chip package including a plurality of chips stacked, and to a method of manufacturing the same.

2. Description of the Related Art

In recent years, a reduction in weight and an improvement in performance have been demanded of mobile devices typified by cellular phones and notebook personal computers. Accordingly, there has been a demand for higher integration of electronic components for use in mobile devices. Higher integration of electronic components has been demanded also for achieving an increase in capacity of semiconductor memory.

As an example of highly integrated electronic components, a system-in-package (hereinafter referred to as SiP), especially an SiP utilizing a three-dimensional packaging technology for stacking a plurality of chips, has attracting attention in recent years. In the present application, a package including a plurality of chips stacked is called a layered chip package. Since the layered chip package allows a reduction in wiring length, it provides the advantage of allowing a higher operation speed for a circuit and a reduction in stray capacitance of wiring, as well as the advantage of allowing higher integration.

Major examples of three-dimensional packaging technology for fabricating a layered chip package include a wire bonding method and a through electrode method. According to the wire bonding method, a plurality of chips are stacked on a substrate and a plurality of electrodes formed on each chip are connected, by wire bonding, to external connecting terminals formed on the substrate. According to the through electrode method, a plurality of through electrodes are formed in each of chips to be stacked and inter-chip wiring is performed through the use of the through electrodes.

The wire bonding method has a problem that it is difficult to reduce the distance between the electrodes so as to avoid contact between wires, and a problem that high resistances of the wires hamper a high-speed operation of a circuit.

The through electrode method is free from the above-mentioned problems of the wire bonding method. Unfortunately, however, the through electrode method requires a large number of steps for forming the through electrodes in chips, and consequently increases the cost for the layered chip package. According to the through electrode method, forming the through electrodes in chips requires a series of steps as follows: forming a plurality of holes for the plurality of through electrodes in a wafer that will be cut later into a plurality of chips; forming an insulating layer and a seed layer in the plurality of holes and on the top surface of the wafer; forming a plurality of through electrodes by filling the plurality of holes with metal such as Cu by plating; and removing unwanted portions of the seed layer.

According to the through electrode method, the through electrodes are formed by filling metal into holes having relatively high aspect ratios. Consequently, voids or keyholes are prone to occur in the through electrodes due to poor filling of the holes with metal, so that the reliability of wiring formed by the through electrodes tends to be reduced.

According to the through electrode method, an upper chip and a lower chip are physically joined to each other by connecting the through electrodes of the upper and lower chips by means of, for example, soldering. The through electrode method therefore requires that the upper and lower chips be accurately aligned and then joined to each other at high temperatures. When the upper and lower chips are joined to each other at high temperatures, however, misalignment between the upper and lower chips can occur due to expansion and contraction of the chips, which often results in electrical connection failure between the upper and lower chips.

U.S. Pat. No. 5,953,588 discloses a method of manufacturing a layered chip package as described below. In this method, a plurality of chips cut out from a processed wafer are embedded into an embedding resin and then a plurality of leads are formed to be connected to each chip, whereby a structure called a neo-wafer is fabricated. Next, the neo-wafer is diced to form a plurality of structures each called a neo-chip. Each neo-chip includes: one or more chips; resin surrounding the chip(s); and a plurality of leads. The plurality of leads connected to each chip each have an end face exposed at a side surface of the neo-chip. Next, a plurality of kinds of neo-chips are laminated into a stack. In the stack, the respective end faces of the plurality of leads connected to the chips of each layer are exposed at the same side surface of the stack.

Keith D. Gann, "Neo-Stacking Technology", HDI Magazine, December 1999, discloses fabricating a stack by the same method as U.S. Pat. No. 5,953,588, and forming wiring on two side surfaces of the stack.

The manufacturing method disclosed in U.S. Pat. No. 5,953,588 involves a number of process steps and this raises the cost for the layered chip package. According to this method, after the plurality of chips cut out from the processed wafer are embedded into the embedding resin, the plurality of leads are formed to be connected to each chip to thereby fabricate the neo-wafer, as described above. Accurate alignment of the plurality of chips is therefore required when fabricating the neo-wafer. This is also a factor that raises the cost for the layered chip package.

U.S. Pat. No. 7,127,807 B2 discloses a multilayer module formed by stacking a plurality of active layers each including a flexible polymer substrate with at least one electronic element and a plurality of electrically-conductive traces formed within the substrate. According to this multilayer module, however, it is impossible to increase the proportion of the area occupied by the electronic element in each active layer, and consequently it is difficult to achieve higher integration.

For a wafer to be cut into a plurality of chips, the yield of the chips, that is, the rate of non-defective chips with respect to all chips obtained from the wafer, is 90% to 99% in many cases. Since a layered chip package includes a plurality of chips, the rate of layered chip packages in which all of the plurality of chips are non-defective is lower than the yield of the chips. The larger the number of chips included in each layered chip package, the lower the rate of layered chip packages in which all of the chips are non-defective.

A case will now be considered where a memory device such as a flash memory is formed using a layered chip package. In general, a redundancy technique of replacing a defective column of memory cells with a redundant column of memory cells is employed in a memory device such as a flash memory so that the memory device can normally function even when some memory cells are defective. In the case where a memory device is formed using a layered chip package, the redundancy technique is also employable to make it possible that, even if some of memory cells included in any chip are defective, the memory device can normally function while using the chip including the defective memory cells. However, if, for example, a chip including a plurality of memory cells and a control circuit has become defective due to a wiring failure in the control circuit and cannot function normally even by employing the redundancy technique, the defective chip is unusable. In this case, the defective chip may be replaced with a non-defective one, but this raises the cost for the layered chip package.

US 2007/0165461 A1 discloses a technique of identifying one or more defective flash memory dies in a flash memory device having a plurality of flash memory dies, and disabling memory access operations to each identified die.

In the case where a memory device is formed using a layered chip package, it would also be possible to identify one or more defective chips included in the layered chip package and to disable the one or more defective chips, as taught in US 2007/0165461 A 1.

However, disabling a defective chip in a layered chip package involves a problem as described below. In a layered chip package, there is provided wiring that connects each chip to a plurality of terminals of the layered chip package. Even if a defective chip is disabled, there remains the wiring. The wiring that connects the defective chip to the plurality of terminals of the layered chip package generates a capacitance or inductance that is unwanted for a device formed using the layered chip package, such as a memory device, and/or generates a stray capacitance between itself and other wiring connected to non-defective chips. This is a hindrance to increasing the operation speed of the device such as the memory device.

OBJECT AND SUMMARY OF THE INVENTION

It is an object of the present invention to provide a layered chip package that includes a plurality of chips stacked and that is capable of disabling the use of a malfunctioning chip while reducing problems attributable to wiring connected to the malfunctioning chip, and to provide a method of manufacturing such a layered chip package.

A layered chip package of the present invention includes: a main body having a top surface, a bottom surface and four side surfaces; and wiring disposed on at least one of the side surfaces of the main body. The main body includes a plurality of layer portions stacked. The plurality of layer portions include at least one layer portion of a first type and at least one layer portion of a second type. The at least one layer portion of the first type and the at least one layer portion of the second type each include a semiconductor chip. The at least one layer portion of the first type further includes a plurality of electrodes each connected to the semiconductor chip and each having an end face located at the at least one of the side surfaces of the main body on which the wiring is disposed, whereas the at least one layer portion of the second type does not include any electrode connected to the semiconductor chip and having an end face located at the at least one of the side surfaces of the main body on which the wiring is disposed. The wiring is connected to the end face of each of the plurality of electrodes.

In the layered chip package of the present invention, the semiconductor chip of the at least one layer portion of the first type may be a normally functioning one whereas the semiconductor chip of the at least one layer portion of the second type may be a malfunctioning one.

In the layered chip package of the present invention, the at least one layer portion of the first type and the at least one layer portion of the second type may each further include an insulating portion covering at least one of four side surfaces of the semiconductor chip. In this case, the insulating portion may have at least one end face located at the at least one of the side surfaces of the main body on which the wiring is disposed, and the end face of each of the plurality of electrodes may be surrounded by the insulating portion.

A layered chip package manufactured by a manufacturing method of the present invention includes: a main body having a top surface, a bottom surface and four side surfaces; and wiring disposed on at least one of the side surfaces of the main body. The main body includes a plurality of layer portions stacked. Each of the plurality of layer portions includes a semiconductor chip. At least one of the plurality of layer portions further includes a plurality of electrodes each connected to the semiconductor chip and each having an end face located at the at least one of the side surfaces of the main body on which the wiring is disposed. The wiring is connected to the end face of each of the plurality of electrodes.

The manufacturing method for the layered chip package of the present invention includes the steps of:

fabricating a plurality of substructures that respectively correspond to the plurality of layer portions of the layered chip package, each substructure including a plurality of its corresponding layer portions and being intended to be cut later at a boundary between every adjacent ones of the plurality of its corresponding layer portions; and completing the layered chip package by fabricating the main body using the plurality of substructures and by forming the wiring on the main body.

The step of fabricating the plurality of substructures includes, as a series of steps for fabricating each substructure, the step of fabricating a pre-substructure wafer by performing processing on a first surface of a semiconductor wafer having the first surface and a second surface that face toward opposite directions, the pre-substructure wafer having a first surface and a second surface that respectively correspond to the first surface and the second surface of the semiconductor wafer and including a plurality of pre-semiconductor-chip portions aligned;

the step of distinguishing between a normally functioning pre-semiconductor-chip portion and a malfunctioning pre-semiconductor-chip portion among the plurality of pre-semiconductor-chip portions included in the pre-substructure wafer; and the step of forming the plurality of electrodes so as to be connected to the normally functioning pre-semiconductor-chip portion, without forming any electrode connected to the malfunctioning pre-semiconductor-chip portion and having an end face located at the at least one of the side surfaces of the main body on which the wiring is disposed.

In the manufacturing method for the layered chip package of the present invention, each of the plurality of layer portions may further include an insulating portion covering at least one of four side surfaces of the semiconductor chip. In this case, the insulating portion may have at least one end face located at the at least one of the side surfaces of the main body on which the wiring is disposed, and the end face of each of the plurality of electrodes may be surrounded by the insulating portion. In this case, the step of fabricating the plurality of substructures further includes, between the step of fabricating the pre-substructure wafer and the step of forming the plurality of electrodes in the series of steps for fabricating each substructure, the step of forming at least one groove in the pre-substructure wafer, the at least one groove opening at the first surface of the pre-substructure wafer and extending to be adjacent to at least one of the pre-semiconductor-chip portions, and the step of forming an insulating layer to fill the at least one groove, the insulating layer being intended to become part of the insulating portion later. In the step of forming the plurality of electrodes, the plurality of electrodes may be formed such that part of each of the electrodes lies on the insulating layer. In the step of completing the layered chip package, the insulating layer may be cut to form a cut surface along a direction in which the at least one groove extends, whereby part of the at least one end face of the insulating portion may be formed by the cut surface of the insulating layer and the end face of each of the plurality of electrodes may be exposed.

In the manufacturing method for the layered chip package of the present invention, the step of completing the layered chip package may include the steps of:

fabricating a layered substructure by stacking the plurality of substructures in correspondence with the order of stacking of the plurality of layer portions of the layered chip package;

forming a main body aggregate by cutting the layered substructure, the main body aggregate including a plurality of pre-main-body portions each of which will later become the main body, the plurality of pre-main-body portions being aligned in one direction that is orthogonal to the stacking direction of the plurality of layer portions;

forming the wiring for each of the pre-main-body portions of the main body aggregate; and cutting the main body aggregate after the formation of the wiring so as to separate the plurality of pre-main-body portions from each other so that each of them becomes the main body and a plurality of layered chip packages are thereby formed.

In the manufacturing method for the layered chip package of the present invention, the step of forming the plurality of electrodes may include the steps of: forming a photoresist layer for use for forming the plurality of electrodes, the photoresist layer including a plurality of portions that respectively correspond to all of the pre-semiconductor-chip portions; forming a frame by patterning the photoresist layer by photolithography, the frame having a plurality of grooves to later accommodate the plurality of electrodes; and forming the plurality of electrodes in the grooves of the frame. In this case, in the step of forming the plurality of electrodes in the grooves of the frame, the plurality of electrodes may be formed by plating.

The step of forming the frame may include an exposure step of exposing the photoresist layer such that a latent image corresponding to the plurality of electrodes is formed on a portion of the photoresist layer corresponding to the normally functioning pre-semiconductor-chip portion, whereas any latent image corresponding to an electrode connected to the malfunctioning pre-semiconductor-chip portion and having an end face located at the at least one of the side surfaces of the main body on which the wiring is disposed is not formed on a portion of the photoresist layer corresponding to the malfunctioning pre-semiconductor-chip portion; and a step of developing the photoresist layer after the exposure step.

The photoresist layer may be negative-working. In this case, the step of forming the frame may include: an exposure step in which a portion of the photoresist layer corresponding to the normally functioning pre-semiconductor-chip portion is exposed in a pattern corresponding to the plurality of electrodes whereas a portion of the photoresist layer corresponding to the malfunctioning pre-semiconductor-chip portion is subjected to an overall exposure; and a step of developing the photoresist layer after the exposure step.

The photoresist layer may be positive-working. In this case, the step of forming the frame may include: an exposure step in which a portion of the photoresist layer corresponding to the normally functioning pre-semiconductor-chip portion is exposed in a pattern corresponding to the plurality of electrodes whereas a portion of the photoresist layer corresponding to the malfunctioning pre-semiconductor-chip portion is not subjected to any exposure; and a step of developing the photoresist layer after the exposure step.

In the case where the photoresist layer is negative-working, the step of forming the frame may include: a first exposure step of exposing all of the plurality of portions of the photoresist layer in a pattern corresponding to the plurality of electrodes; a second exposure step of subjecting only a portion of the photoresist layer corresponding to the malfunctioning pre-semiconductor-chip portion to an overall exposure before or after the first exposure step; and a step of developing the photoresist layer after the first and second exposure steps.

The layered chip package or its manufacturing method of the present invention allows disabling the use of a malfunctioning chip while reducing problems attributable to wiring connected to the malfunctioning chip.

Other and further objects, features and advantages of the invention will appear more fully from the following description.

DETAILED DESCRIPTION OF THE PREFERRED EMBODIMENTS

First Embodiment

Figure 1:
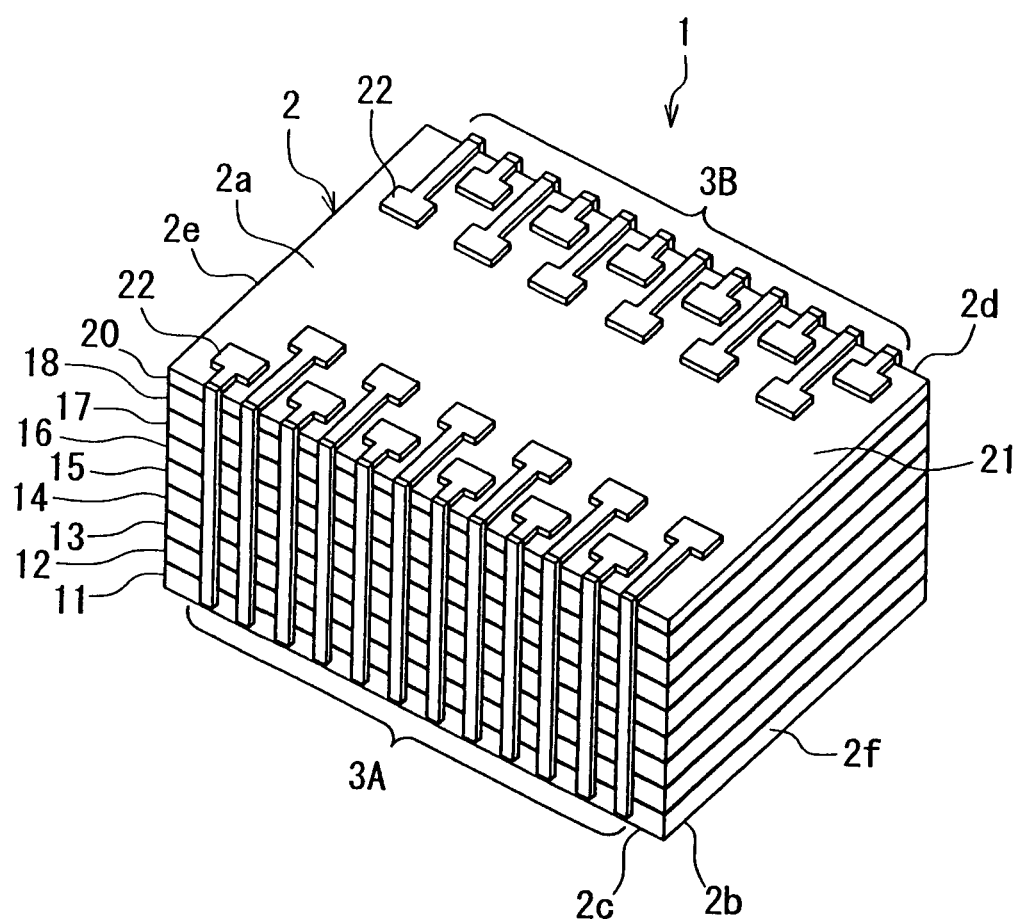
FIG. 1 is a perspective view of a layered chip package of a first embodiment of the invention.
Figure 2:
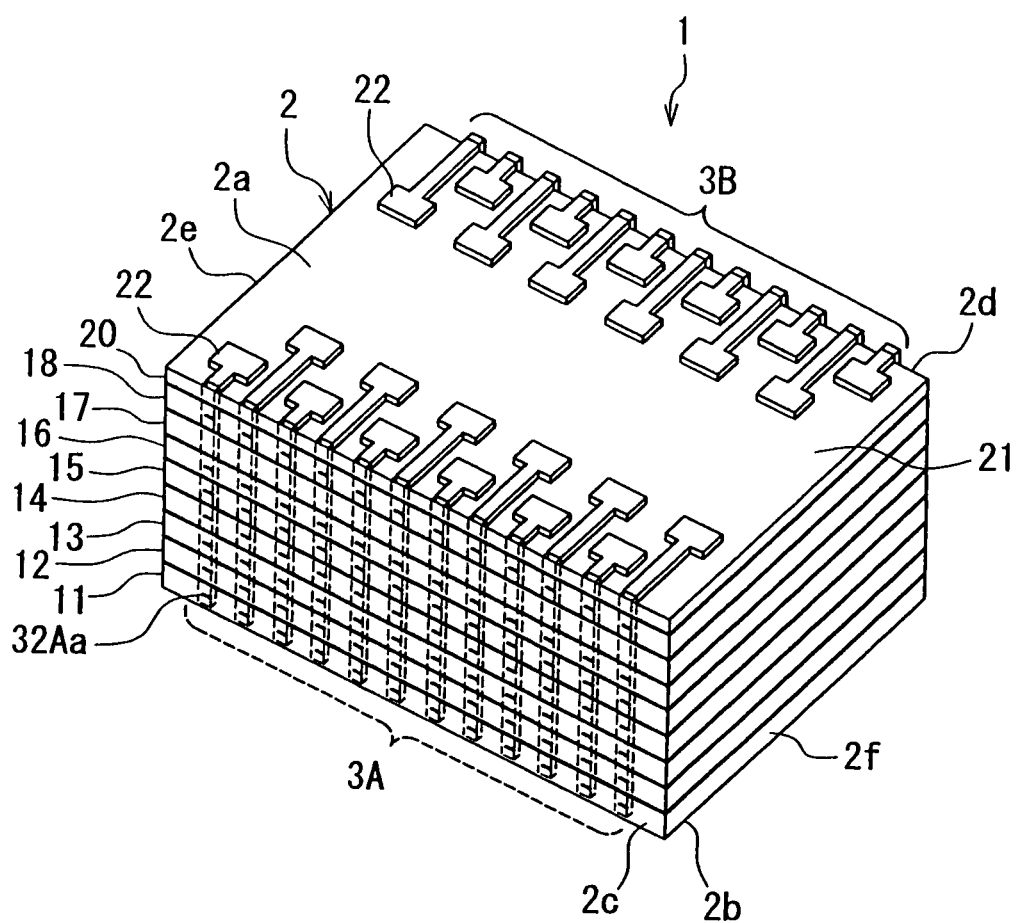
FIG. 2 is a perspective view showing the layered chip package of FIG. 1 such that respective end faces of a plurality of first electrodes are visible.

Embodiments of the present invention will now be described in detail with reference to the drawings. Reference is first made to FIG. 1 and FIG. 2 to describe the configuration of a layered chip package of a first embodiment of the invention. FIG. 1 is a perspective view of the layered chip package of the first embodiment. As shown in FIG. 1, the layered chip package 1 of the first embodiment includes a main body 2 that is rectangular-solid-shaped. The main body 2 has a top surface 2a, a bottom surface 2b, a first side surface 2c and a second side surface 2d facing toward opposite directions, and a third side surface 2e and a fourth side surface 2f facing toward opposite directions.

The layered chip package 1 further includes wiring disposed on at least one of the side surfaces of the main body 2. In the example shown in FIG. 1, the layered chip package 1 includes first wiring 3A disposed on the first side surface 2c of the main body 2, and second wiring 3B disposed on the second side surface 2d of the main body 2. In the following description, any wiring is represented by reference numeral 3. FIG. 2 is a view of the layered chip package 1 of FIG. 1 showing the first side surface 2c of the main body 2, with the first wiring 3A shown with broken lines.

The main body 2 includes a plurality of layer portions stacked. By way of example, FIG. 1 and FIG. 2 show that the main body 2 includes eight layer portions 11, 12, 13, 14, 15, 16, 17 and 18 that are stacked in this order from the bottom. The number of the layer portions to be included in the main body 2 is not limited to eight, and may be any plural number. In the following description, any layer portion is represented by reference numeral 10.

The main body 2 further includes a terminal layer 20 laid on the uppermost layer portion 18. Every vertically adjacent two of the layer portions are bonded to each other with an adhesive, and so are the layer portion 18 and the terminal layer 20 to each other. The layer portions 11 to 18 and the terminal layer 20 each have a top surface, a bottom surface, and four side surfaces. The terminal layer 20 includes a terminal layer main body 21 having a top surface and a bottom surface, and a plurality of pad-shaped terminals 22 disposed on the top surface of the terminal layer main body 21. The plurality of pad-shaped terminals 22 function as external connecting terminals of the layered chip package 1. Some of the pad-shaped terminals 22 each have an end face located at the side surface 2c of the main body 2, and the first wiring 3A is connected to these end faces. Other some of the pad-shaped terminals 22 each have an end face located at the side surface 2d of the main body 2, and the second wiring 3B is connected to these end faces.

The plurality of layer portions 10 include at least one layer portion of a first type and at least one layer portion of a second type. FIG. 2 shows an example in which the layer portion 17 is of the second type, whereas the other layer portions 11 to 16 and 18 are of the first type. The difference between the first type and the second type will be described in detail later.

Figure 3:
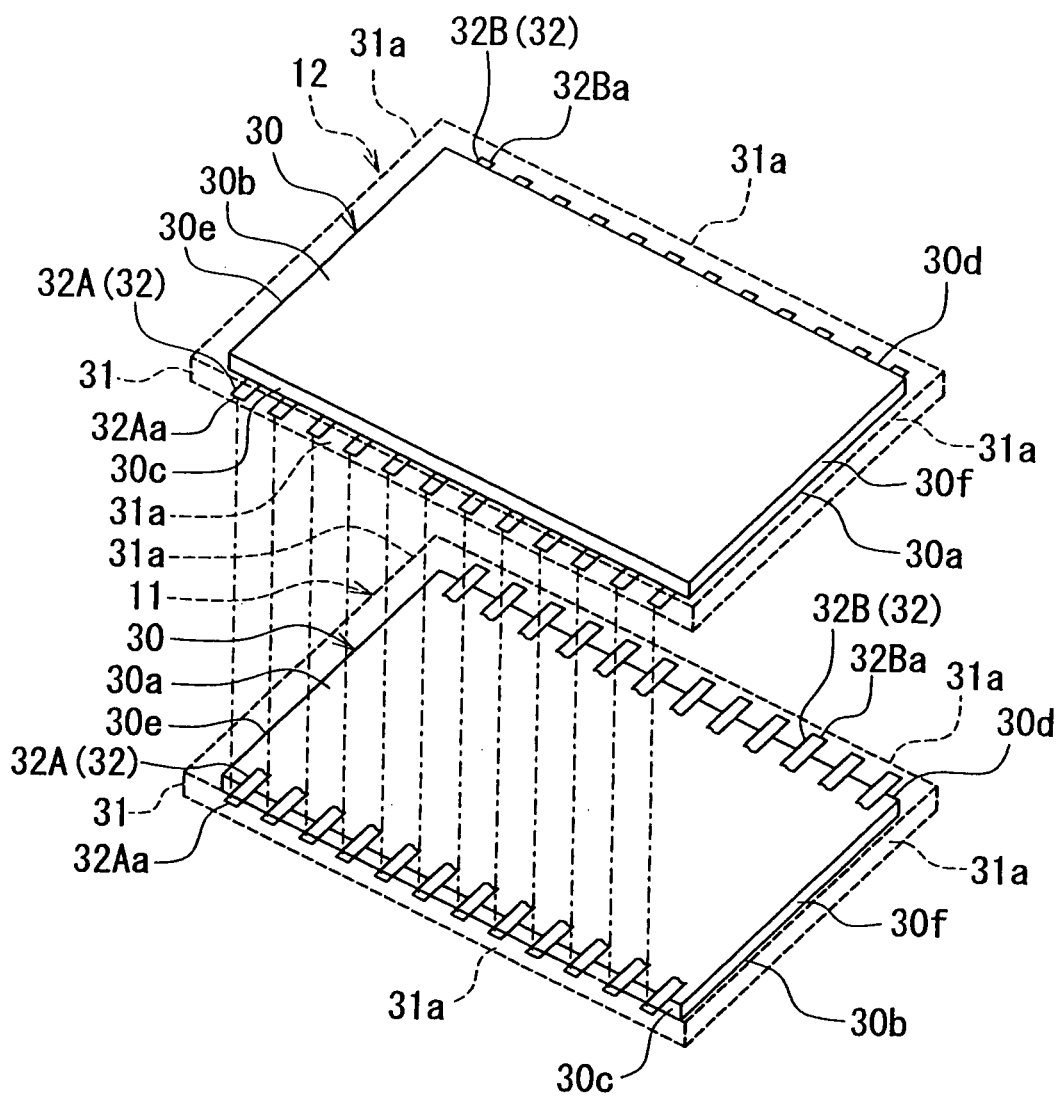
FIG. 3 is an exploded perspective view of a pair of layer portions included in the layered chip package of FIG. 1.

FIG. 3 is an exploded perspective view of a pair of layer portions included in the layered chip package 1 of FIG. 1. As shown in FIG. 3, each of the layer portions 11 and 12 includes a semiconductor chip 30. The semiconductor chip 30 has: a first surface 30a having a device formed thereon; a second surface 30b opposite to the first surface 30a; a first side surface 30c and a second side surface 30d facing toward opposite directions; and a third side surface 30e and a fourth side surface 30f facing toward opposite directions. The side surfaces 30c, 30d, 30e and 30f respectively face toward the side surfaces 2c, 2d, 2e and 2f of the main body 2. The layer portions 11 and 12 are disposed such that the first surfaces 30a of their respective semiconductor chips 30 face toward each other. The layered chip package 1 shown in FIG. 1 and FIG. 2 includes four pairs of layer portions 10, each pair of layer portions 10 being disposed such that the first surfaces 30a of their respective semiconductor chips 30 face toward each other.

Each of the layer portions 11 and 12 further includes: an insulating portion 31 covering at least one of the four side surfaces of the semiconductor chip 30; and a plurality of electrodes 32 connected to the semiconductor chip 30. The insulating portion 31 has at least one end face 31a located at the at least one of the side surfaces of the main body 2 on which the wiring is disposed. In the example shown in FIG. 3, the insulating portion 31 covers all of the four side surfaces of the semiconductor chip 30, and has four end faces 31a that are respectively located at the four side surfaces of the main body 2. In this example, the insulating portion 31 further covers the first surface 30a of the semiconductor chip 30.

In the example shown in FIG. 3, the plurality of electrodes 32 include a plurality of first electrodes 32A and a plurality of second electrodes 32B. Each of the plurality of first electrodes 32A has an end face 32Aa that is located at the first side surface 2c of the main body 2 and surrounded by the insulating portion 31. Each of the plurality of second electrodes 32B has an end face 32Ba that is located at the second side surface 2d of the main body 2 and surrounded by the insulating portion 31. The first wiring 3A disposed on the first side surface 2c of the main body 2 is connected to the end faces 32Aa of the plurality of first electrodes 32A of the plurality of layer portions 10. The second wiring 3B disposed on the second side surface 2d of the main body 2 is connected to the end faces 32Ba of the plurality of second electrodes 32B of the plurality of layer portions 10. In the following description, any electrode is represented by reference numeral 32, and the end face of any electrode 32 is represented by reference numeral 32a.

A pair of layer portions 13 and 14, and a pair of layer portions 15 and 16 each have the same configuration as the pair of layer portions 11 and 12 shown in FIG. 3. The layer portion 18 has the same configuration as the layer portion 12 shown in FIG. 3. The layer portion 17, which is a layer portion of the second type, does not include any electrode connected to the semiconductor chip 30 and having an end face located at the at least one of the side surfaces of the main body 2 on which the wiring 3 is disposed. Consequently, as shown in FIG. 2, there are not any end faces of electrodes at the side surfaces of the layer portion 17. The remainder of the configuration of the layer portion 17 is the same as that of the layer portion 11 of FIG. 3. The semiconductor chips 30 of the layer portions 11 to 16 and 18, which are layer portions of the first type, are normally functioning ones, whereas the semiconductor chip 30 of the layer portion 17, which is a layer portion of the second type, is a malfunctioning one. Hereinafter, a normally functioning semiconductor chip 30 will be called a non-defective semiconductor chip 30, and a malfunctioning semiconductor chip 30 will be called a defective semiconductor chip 30. A layer portion 10 of the second type may include any electrode or wiring other than one connected to the semiconductor chip 30 and having an end face located at the at least one of the side surfaces of the main body 2 on which the wiring 3 is disposed. For example, a layer portion 10 of the second type may include an electrode that is connected to the semiconductor chip 30 but does not have an end face located at the at least one of the side surfaces of the main body 2 on which the wiring 3 is disposed, and/or wiring for connecting terminals of the semiconductor chip 30 to each other.

The semiconductor chip 30 may be a memory chip constituting a memory such as a flash memory, DRAM, SRAM, MRAM, PROM or FeRAM. In this case, a large-capacity memory is provided by the layered chip package 1 including a plurality of semiconductor chips 30. Furthermore, according to the layered chip package 1 of the present embodiment, it is possible to easily provide a memory of various capacities such as 64 GB (gigabytes), 128 GB and 256 GB by varying the number of the semiconductor chips 30 included in the layered chip package 1.

The layered chip package 1 may include a plurality of semiconductor chips 30 serving as memory chips that constitute different types of memory. The layered chip package 1 may include a semiconductor chip 30 serving as a memory chip, and another semiconductor chip 30 serving as a controller for controlling the memory chip.

In the case where a semiconductor chip 30 includes a plurality of memory cells and where one or more of the memory cells are defective, the semiconductor chip 30 is non-defective if it can function normally by employing the redundancy technique.

The semiconductor chips 30 are not limited to memory chips, and may provide other devices such as CPUs, sensors, and driving circuits for sensors. The layered chip package 1 of the present embodiment is particularly suitable for providing an SiP.

A manufacturing method for the layered chip package 1 of the present embodiment will now be described. The manufacturing method for the layered chip package 1 of the present embodiment includes the steps of: fabricating a plurality of substructures that respectively correspond to the plurality of layer portions 10 of the layered chip package 1, each substructure including a plurality of its corresponding layer portions 10 and being intended to be cut later at a boundary between every adjacent ones of the plurality of its corresponding layer portions 10; and completing the layered chip package 1 by fabricating the main body 2 using the plurality of substructures and by forming the wiring 3A, 3B on the main body 2.

The step of completing the layered chip package 1 includes the steps of: fabricating a layered substructure by stacking the plurality of substructures in correspondence with the order of stacking of the plurality of layer portions 10 of the layered chip package 1; forming a main body aggregate by cutting the layered substructure, the main body aggregate including a plurality of pre-main-body portions each of which will later become the main body 2, the plurality of pre-main-body portions being aligned in one direction that is orthogonal to the stacking direction of the plurality of layer portions 10; forming the wiring 3A, 3B for each of the pre-main-body portions of the main body aggregate; and cutting the main body aggregate after the formation of the wiring 3A, 3B so as to separate the plurality of pre-main-body portions from each other so that each of them becomes the main body 2 and a plurality of layered chip packages 1 are thereby formed. The plurality of substructures may each include a plurality of layer portions 10 of the same kind.

With reference to FIG. 4 to FIG. 23, a detailed description will now be made on the step of fabricating the plurality of substructures in the manufacturing method for the layered chip package 1 of the present embodiment. In the step of fabricating the plurality of substructures, first, a plurality of pre-substructure wafers that respectively correspond to the plurality of layer portions 10 of the layered chip package 1 are fabricated.

Figure 4:
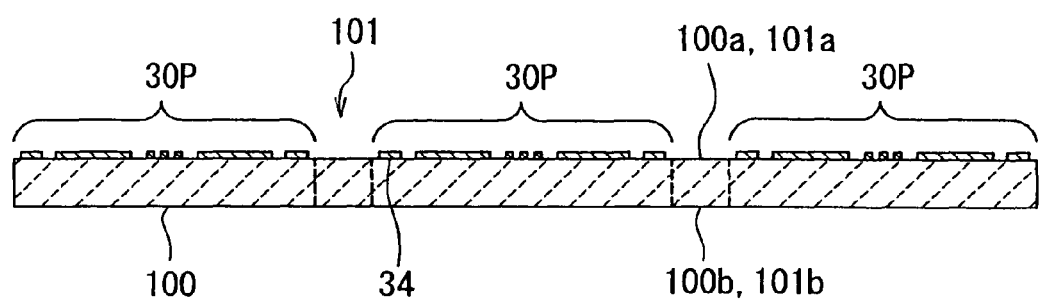
FIG. 4 is a cross-sectional view of a portion of a pre-substructure wafer fabricated in a step of a manufacturing method for the layered chip package of the first embodiment of the invention.

FIG. 4 shows the step of fabricating a single pre-substructure wafer. In this step, a semiconductor wafer 100 having a first surface 100a and a second surface 100b that face toward opposite directions is subjected to processing, such as a wafer process, at the first surface 100a, to thereby fabricate a pre-substructure wafer 101 that includes a plurality of pre-semiconductor-chip portions 30P aligned. The plurality of pre-semiconductor-chip portions 30P each include a device, and are to become the plurality of semiconductor chips 30 later. The plurality of pre-semiconductor-chip portions 30P of the pre-substructure wafer 101 may later become a plurality of the same kind of semiconductor chips 30. The pre-substructure wafer 101 has a first surface 101a corresponding to the first surface 100a of the semiconductor wafer 100, and a second surface 101b corresponding to the second surface 100b of the semiconductor wafer 100. In the pre-substructure wafer 101, the plurality of pre-semiconductor-chip portions 30P may be aligned in a row, or may be aligned in a plurality of rows such that a plurality of ones of the pre-semiconductor-chip portions 30P are aligned in each of vertical and horizontal directions. In the following description, it is assumed that the plurality of pre-semiconductor-chip portions 30P are aligned in a plurality of rows such that a plurality of ones of the pre-semiconductor-chip portions 30P are aligned in each of vertical and horizontal directions in the pre-substructure wafer 101.

The semiconductor wafer 100 may be a silicon wafer, for example. The wafer process is a process in which a wafer is processed into a plurality of devices that are not yet separated into a plurality of chips. In the pre-substructure wafer 101, the first surface 101a is a device formation surface on which devices are formed. Each of the plurality of pre-semiconductor-chip portions 30P has a plurality of pad-shaped terminals 34 disposed on the first surface 101a of the pre-substructure wafer 101.

Figure 9:
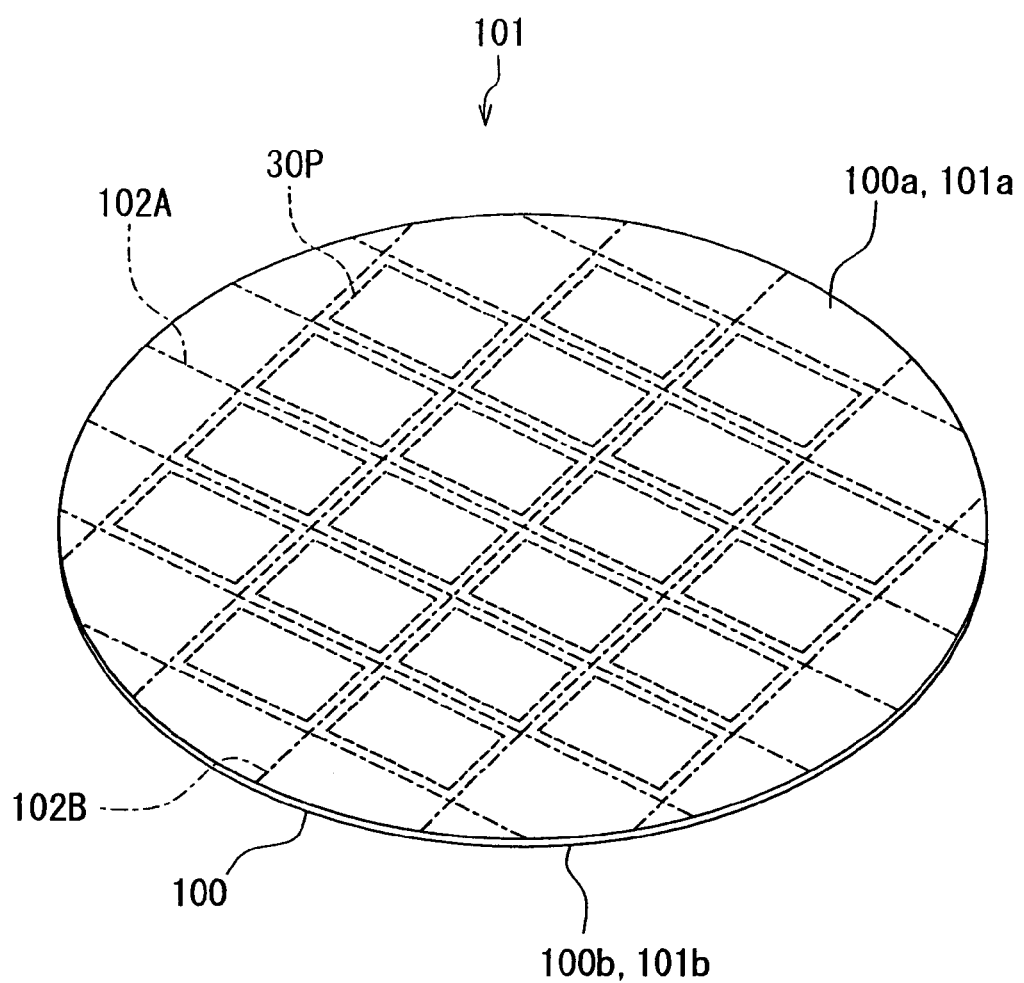
FIG. 9 is a perspective view of the pre-substructure wafer fabricated in the step of FIG. 4.

FIG. 9 is a perspective view of the pre-substructure wafer 101. As shown in FIG. 9, the pre-substructure wafer 101 is provided with a plurality of scribe lines 102A and a plurality of scribe lines 102B. The scribe lines 102A extend horizontally to pass through boundaries between every two pre-semiconductor-chip portions 30P that are vertically adjacent to each other. The scribe lines 102B extend vertically to pass through boundaries between every two pre-semiconductor-chip portions 30P that are horizontally adjacent to each other. To facilitate understanding, FIG. 9 depicts the pre-semiconductor-chip portions 30P larger relative to the semiconductor wafer 100. For example, assuming that the semiconductor wafer 100 is a 12-inch wafer and a side of the top surface of each pre-semiconductor-chip portion 30 is 8 to 10 mm long, 700 to 900 pre-semiconductor-chip portions 30P are obtainable from a single semiconductor wafer 100.

Figure 10:
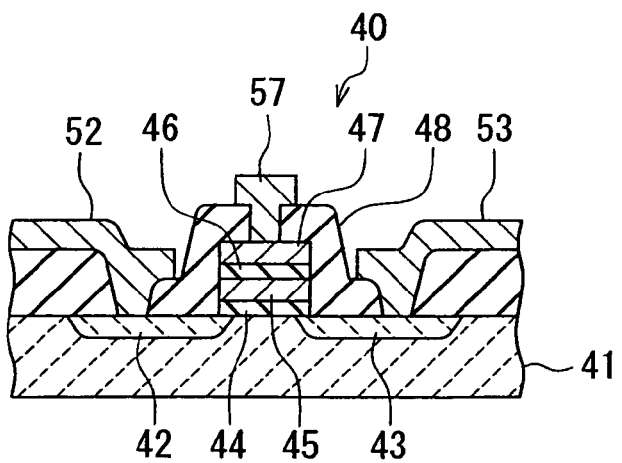
FIG. 10 is a cross-sectional view illustrating an example of the internal structure of a pre-semiconductor-chip portion of the pre-substructure wafer of FIG. 9.

FIG. 10 is a cross-sectional view illustrating an example of the internal structure of each pre-semiconductor-chip portion 30P of the pre-substructure wafer 101 of FIG. 9. Here is given an example in which a plurality of memory cells of a flash memory are formed as a device in the pre-semiconductor-chip portion 30P. FIG. 10 shows one of the plurality of memory cells as a device formed in the pre-semiconductor-chip portion 30P. The memory cell 40 includes a source 42 and a drain 43 formed near a surface of a P-type silicon substrate 41 composed of the semiconductor wafer 100, i.e., near the first surface 100a of the semiconductor wafer 100. The source 42 and the drain 43 are both N-type regions. The source 42 and the drain 43 are disposed at a predetermined distance from each other so that a channel composed of a portion of the P-type silicon substrate 41 is provided between the source 42 and the drain 43. The memory cell 40 further includes an insulating film 44, a floating gate 45, an insulating film 46 and a control gate 47 that are stacked in this order on the surface of the substrate 41 at the location between the source 42 and the drain 43. The memory cell 40 further includes an insulating layer 48 covering the source 42, the drain 43, the insulating film 44, the floating gate 45, the insulating film 46 and the control gate 47. The insulating layer 48 has contact holes that open at the tops of the source 42, the drain 43 and the control gate 47, respectively. The memory cell 40 includes a source electrode 52, a drain electrode 53, and a control gate electrode 57 that are formed on the insulating layer 48 at locations above the source 42, the drain 43 and the control gate 47, respectively. The source electrode 52, the drain electrode 53 and the control gate electrode 57 are connected to the source 42, the drain 43 and the control gate 47, respectively, through the respective contact holes.

A plurality of pre-substructure wafers 101 that respectively correspond to the plurality of layer portions 10 of the layered chip package 1 are each fabricated through the step described with reference to FIG. 4.

Next, a wafer sort test is performed on each of the plurality of pre-substructure wafers 101 to distinguish between a normally functioning pre-semiconductor-chip portion 30P and a malfunctioning pre-semiconductor-chip portion 30P among the plurality of pre-semiconductor-chip portions 30P included in each pre-substructure wafer 101. In the wafer sort test, a probe of a testing device is brought into contact with the terminals 34 of each pre-semiconductor-chip portion 30P and whether the pre-semiconductor-chip portion 30P functions normally or not is thereby tested with the testing device.

Figure 5:
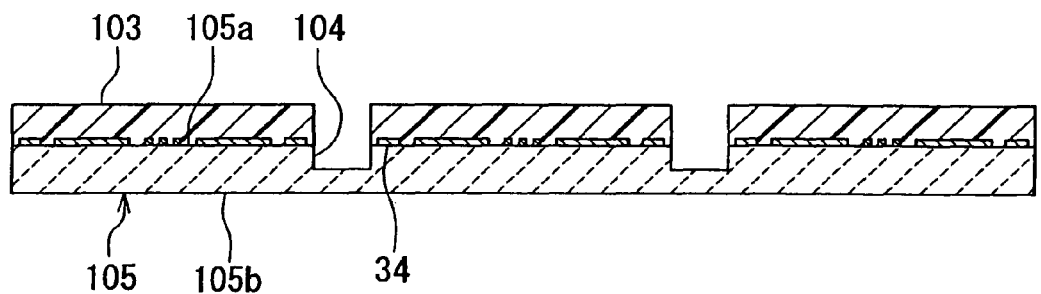
FIG. 5 is a cross-sectional view of a portion of a pre-polishing substructure main body fabricated in a step that follows a distinction step performed on the pre-substructure wafer of FIG. 4.

FIG. 5 shows the next step. In this step, first, a protection film 103 made of, for example, photoresist, is formed to cover the entire first surface 101a of the pre-substructure wafer 101. Next, at least one groove 104 is formed in the pre-substructure wafer 101. The at least one groove 104 opens at the first surface 101a of the pre-substructure wafer 101 and extends to be adjacent to at least one of the pre-semiconductor-chip portions 30P. Here, a plurality of grooves 104 are formed as shown in FIG. 5. At the positions of the boundaries between every two adjacent pre-semiconductor-chip portions 30P, the grooves 104 are formed to pass through the boundaries between every two adjacent pre-semiconductor-chip portions 30P. In this way, a pre-polishing substructure main body 105 is formed by the pre-substructure wafer 101 having undergone the formation of the plurality of grooves 104 therein. The pre-polishing substructure main body 105 includes the plurality of pre-semiconductor-chip portions 30P. The pre-polishing substructure main body 105 has a first surface 105a and a second surface 105b. The first surface 105a corresponds to the first surface 100a of the semiconductor wafer 100 and the first surface 101a of the pre-substructure wafer 101. The second surface 105b corresponds to the second surface 100b of the semiconductor wafer 100 and the second surface 101b of the pre-substructure wafer 101. The pre-polishing substructure main body 105 further has the plurality of grooves 104 that open at the first surface 105a. In the pre-polishing substructure main body 105, the first surface 105a is a device formation surface on which devices are formed.

The plurality of grooves 104 are formed along the scribe lines 102A and 102B shown in FIG. 9. The grooves 104 are formed such that their bottoms do not reach the second surface 101b of the pre-substructure wafer 101. The grooves 104 are each 10 to 150 μm wide, for example. The grooves 104 are each 30 to 150 μm deep, for example. The grooves 104 may be formed using a dicing saw, or by etching such as reactive ion etching.

Figure 11:
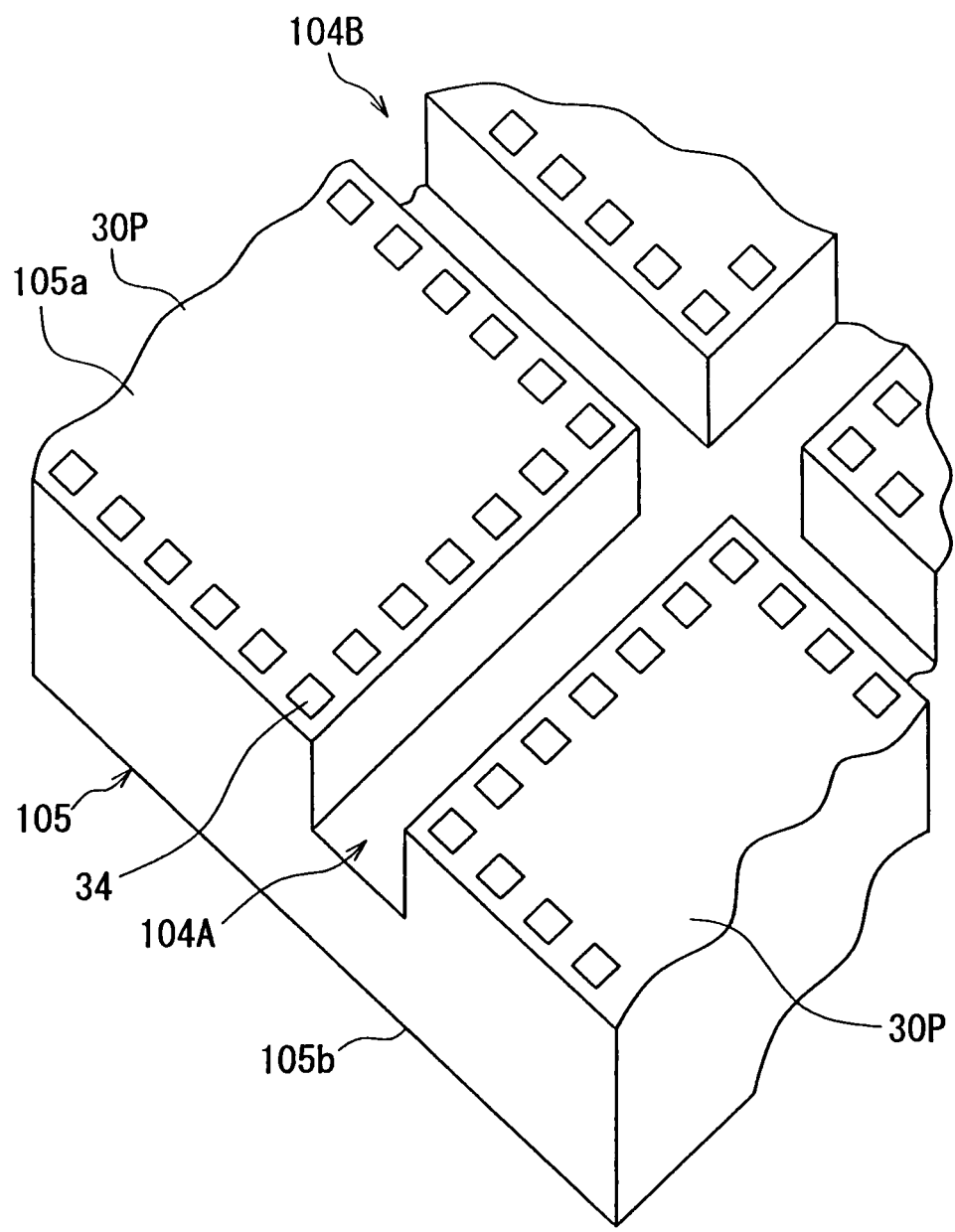
FIG. 11 is a perspective view of a portion of the pre-polishing substructure main body fabricated in the step of FIG. 5.

FIG. 11 shows a portion of the pre-polishing substructure main body 105 fabricated in the step of FIG. 5. In the present embodiment, the plurality of grooves 104 include a plurality of first grooves 104A and a plurality of second grooves 104B. The first grooves 104A and the second grooves 104B extend in directions orthogonal to each other. FIG. 11 shows only one each of the first and second grooves 104A and 104B. The first grooves 104A are formed along the scribe lines 102A shown in FIG. 9, and the second grooves 104B are formed along the scribe lines 102B shown in FIG. 9.

Figure 6:
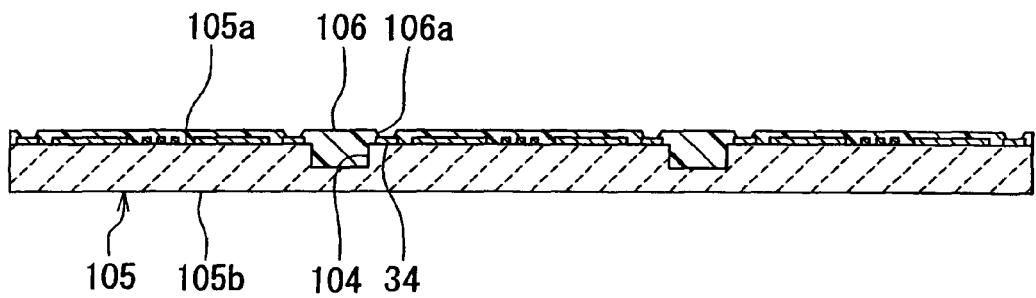
FIG. 6 is a cross-sectional view of a portion of a structure fabricated in a step that follows the step of FIG. 5.

FIG. 6 shows a step that follows the step of FIG. 5. In this step, first, an insulating layer 106 is formed to fill the plurality of grooves 104 of the pre-polishing substructure main body 105 and to cover the plurality of terminals 34. The insulating layer 106 will later become part of the insulating portion 31. Next, a plurality of openings 106a for exposing the terminals 34 are formed in the insulating layer 106.

The insulating layer 106 may be formed of a resin such as an epoxy resin or a polyimide resin. The insulating layer 106 may also be formed of a photosensitive material such as a polyimide resin containing a sensitizer. If the insulating layer 106 is formed of a photosensitive material, the openings 106a of the insulating layer 106 may be formed by photolithography. If the insulating layer 106 is formed of a non-photosensitive material, the openings 106a of the insulating layer 106 may be formed by selectively etching the insulating layer 106.

The insulating layer 106 may include a first layer that fills the grooves 104, and a second layer that covers the first layer and the terminals 34. In this case, the openings 106a are formed in the second layer. Both of the first layer and the second layer may be formed of a resin such as an epoxy resin or a polyimide resin. The second layer may be formed of a photosensitive material such as a polyimide resin containing a sensitizer. If the second layer is formed of a photosensitive material, the openings 106a may be formed in the second layer by photolithography. If the second layer is formed of a non-photosensitive material, the openings 106a may be formed in the second layer by selectively etching the second layer.

It is preferable that the insulating layer 106 be formed of a resin having a low thermal expansion coefficient. Forming the insulating layer 106 of a resin having a low thermal expansion coefficient serves to facilitate cutting of the insulating layer 106 when the insulating layer 106 is cut later with a dicing saw.

It is preferable that the insulating layer 106 be transparent. If the insulating layer 106 is transparent, it is possible to easily recognize alignment marks that will be formed on the insulating layer 106 later, through the insulating layer 106.

Figure 7:
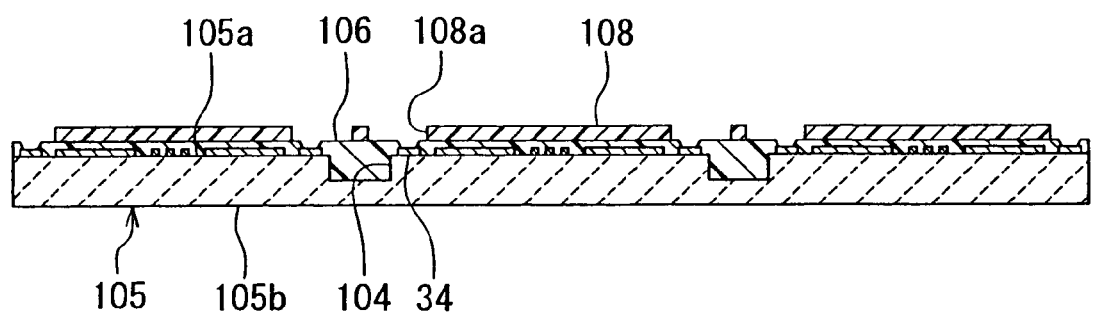
FIG. 7 is a cross-sectional view of a portion of a structure fabricated in a step that follows the step of FIG. 6.

FIG. 7 shows a step that follows the step of FIG. 6. In this step, first, a photoresist layer is formed on the insulating layer 106 to cover the plurality of pre-semiconductor-chip portions 30P. The photoresist layer is intended to be used for forming the plurality of electrodes 32. The photoresist layer includes a plurality of portions that respectively correspond to all of the pre-semiconductor-chip portions 30P. Each portion of the photoresist layer corresponding to a single pre-semiconductor-chip portion 30P covers not only the pre-semiconductor-chip portion 30P but also an area where electrodes 32 to be connected to the pre-semiconductor-chip portion 30P are located. Next, the photoresist layer is patterned by photolithography to thereby form a frame 108 having a plurality of grooves 108a to later accommodate the electrodes 32. The grooves 108a are not formed in a portion of the frame 108 corresponding to a malfunctioning pre-semiconductor-chip portion 30P. Because the grooves 108a are not formed in the portion of the frame 108 corresponding to the malfunctioning pre-semiconductor-chip portion 30P, electrodes 32 are correspondingly not formed in the portion of the frame 108 corresponding to the malfunctioning pre-semiconductor-chip portion 30P. The step of forming the frame 108 will be described in detail later.

Figure 8:
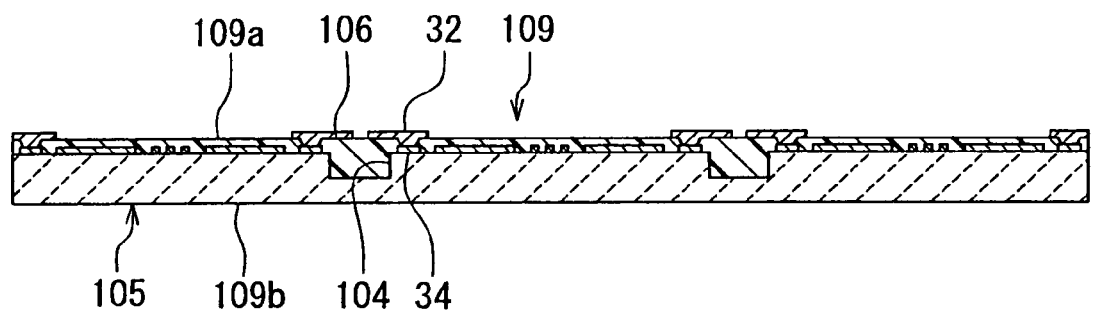
FIG. 8 is a cross-sectional view of a portion of a pre-polishing substructure fabricated in a step that follows the step of FIG. 7.
Figure 12:
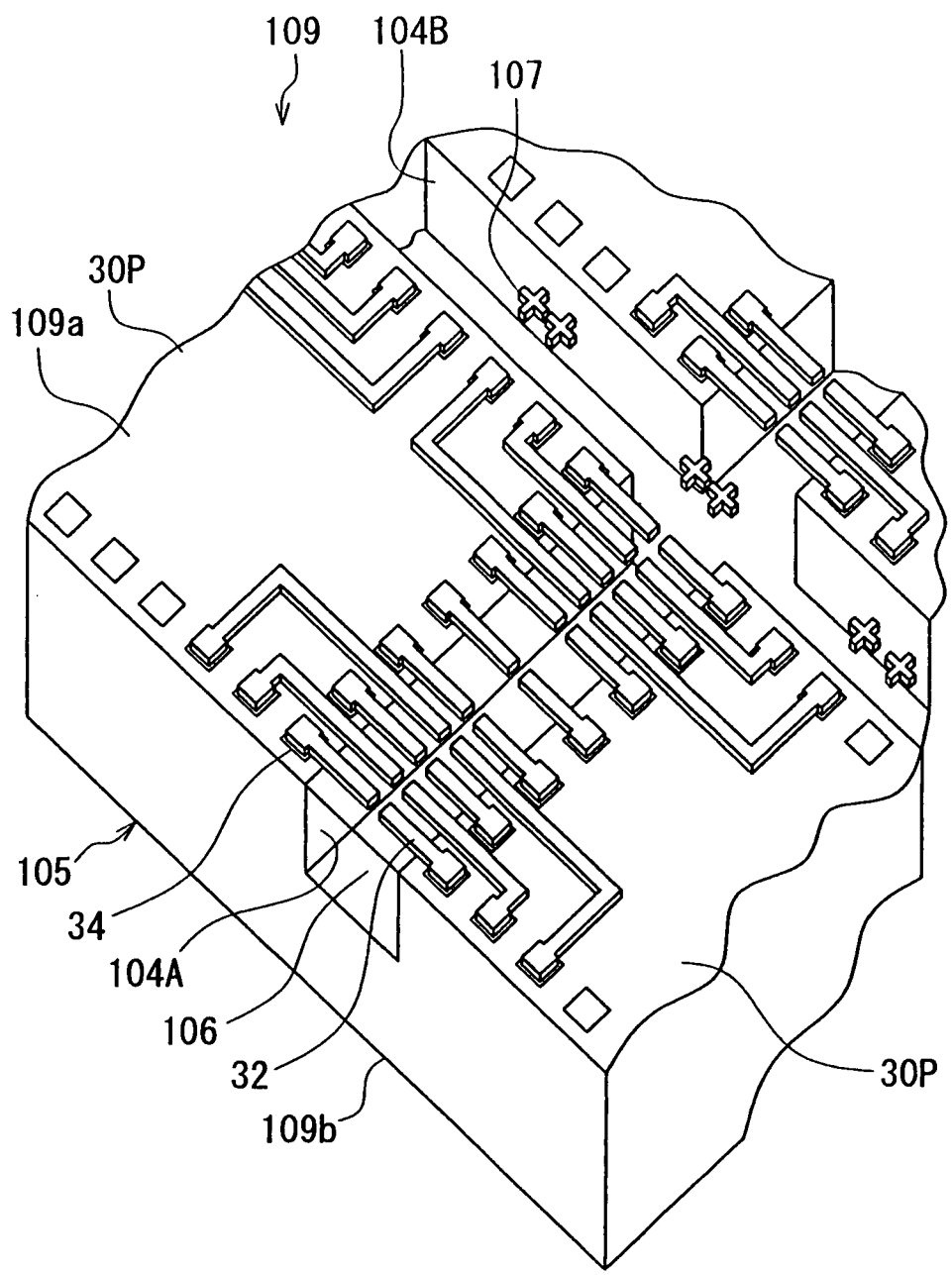
FIG. 12 is a perspective view of a portion of the pre-polishing substructure fabricated in the step of FIG. 8.

FIG. 8 shows a step that follows the step of FIG. 7. In this step, the electrodes 32 are formed in the grooves 108a of the frame 108 by, for example, plating. The electrodes 32 are formed such that part of each of the electrodes 32 lies on the insulating layer 106. The electrodes 32 are connected to the terminals 34 through the openings 106a. FIG. 12 shows a portion of the structure fabricated in the step of FIG. 8.

The electrodes 32 are formed of a conductive material such as Cu. In the case of forming the electrodes 32 by plating, a seed layer for plating is formed on the insulating layer 106 before forming the photoresist layer. Next, the photoresist layer is formed on the seed layer and patterned by photolithography to thereby form the frame 108. The photoresist layer is formed to be 10 to 20 μm thick, for example. Next, plating layers to become part of the electrodes 32 are formed by plating on the seed layer in the grooves of the frame 108. The plating layers are formed to be 5 to 15 μm thick, for example. Next, the frame 108 is removed and the seed layer except portions thereof located below the plating layers is also removed by etching. As a result, the electrodes 32 are formed of the plating layers and the portions of the seed layer remaining therebelow.

As shown in FIG. 12, in the step of forming the plurality of electrodes 32, a plurality of alignment marks 107 are formed on the insulating layer 106 simultaneously with the formation of the electrodes 32. The alignment marks 107 are disposed above the grooves 104. The material and forming method of the alignment marks 107 are the same as those of the electrodes 32.

A pre-polishing substructure 109 shown in FIG. 8 and FIG. 12 is thus fabricated. The pre-polishing substructure 109 includes: the pre-polishing substructure main body 105; the insulating layer 106 that fills the grooves 104 of the pre-polishing substructure main body 105 and that will later become part of the insulating portion 31; the plurality of electrodes 32 each having a portion lying on the insulating layer 106; and the plurality of alignment marks 107 disposed on the insulating layer 106. The pre-polishing substructure 109 has a first surface 109a and a second surface 109b. The first surface 109a corresponds to the first surface 100a of the semiconductor wafer 100 and the first surface 101a of the pre-substructure wafer 101. The second surface 109b corresponds to the second surface 100b of the semiconductor wafer 100 and the second surface 101b of the pre-substructure wafer 101.

A plurality of pre-polishing substructures 109 that respectively correspond to the plurality of layer portions 10 of the layered chip package 1 are each fabricated through the steps described with reference to FIG. 5 to FIG. 8.

Figure 13:
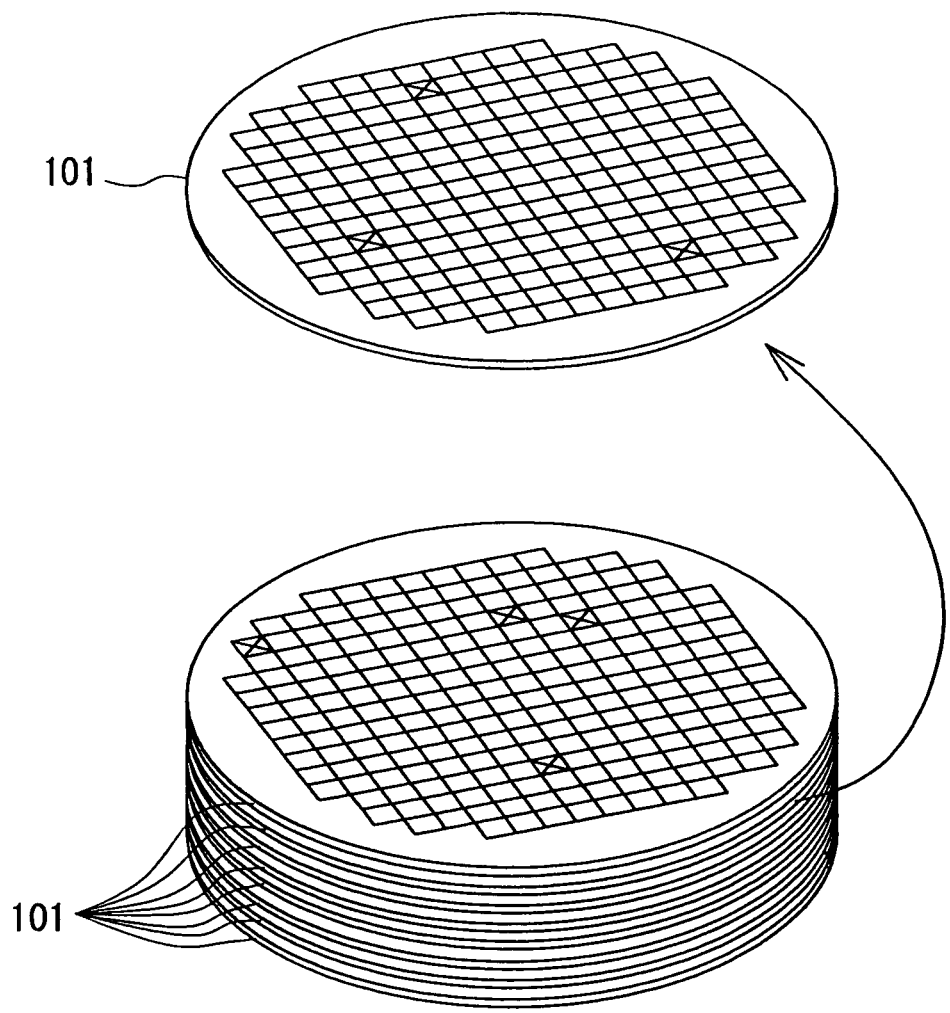
FIG. 13 is an illustrative view showing the step of distinguishing between a normally functioning pre-semiconductor-chip portion and a malfunctioning pre-semiconductor-chip portion in the manufacturing method for the layered chip package of the first embodiment of the invention.

The step of forming the frame 108 and the step of forming the plurality of electrodes 32 will now be described in detail with reference to FIG. 13 to FIG. 18. FIG. 13 shows a plurality of pre-substructure wafers 101 that respectively correspond to the plurality of layer portions 10 of the layered chip package 1. As previously described, the process of distinguishing between a normally functioning pre-semiconductor-chip portion 30P and a malfunctioning pre-semiconductor-chip portion 30P has been performed on the plurality of pre-semiconductor-chip portions 30P included in each pre-substructure wafer 101 by the wafer sort test. In FIG. 13, squares marked with "X" represent malfunctioning pre-semiconductor-chip portions 30P, and the remaining squares represent normally functioning pre-semiconductor-chip portions 30P. The wafer sort test provides location information on the normally functioning pre-semiconductor-chip portions 30P and the malfunctioning pre-semiconductor-chip portions 30P in each pre-substructure wafer 101. This location information will be used later in an exposure step for forming the frame 108.

Figure 14:
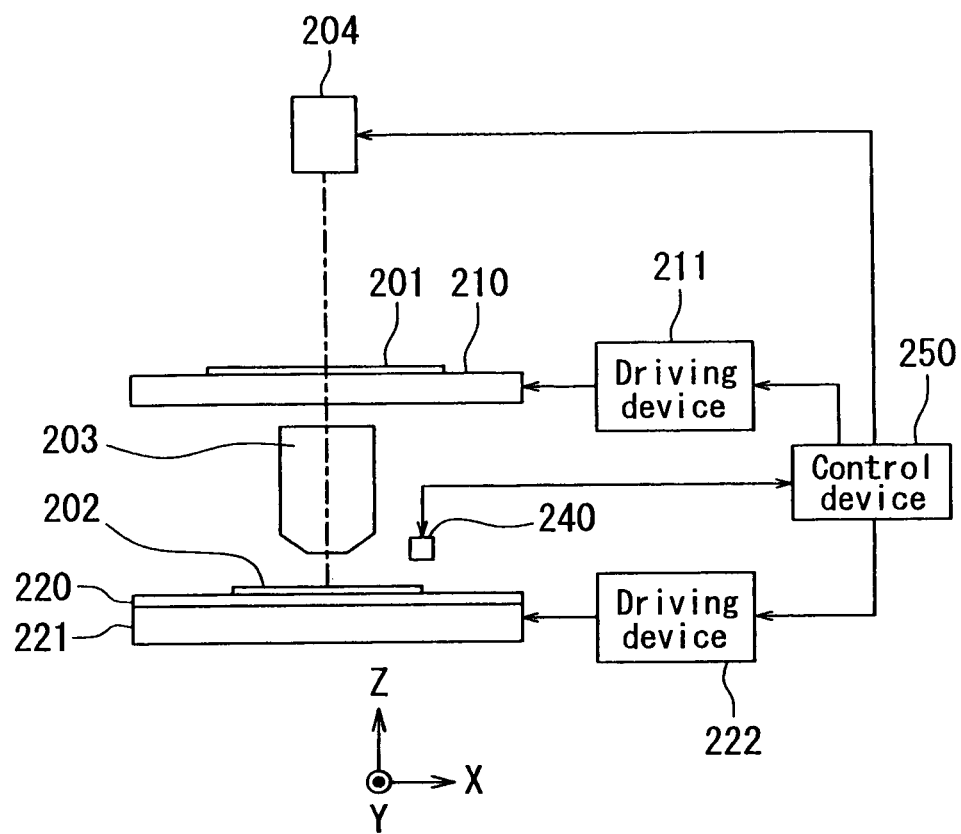
FIG. 14 is an illustrative view showing an example of configuration of an exposure apparatus for use in the manufacturing method for the layered chip package of the first embodiment of the invention.

FIG. 14 is an illustrative view showing an example of configuration of an exposure apparatus used in the manufacturing method for the layered chip package 1 of the present embodiment. The exposure apparatus shown in FIG. 14 is a stepping projection exposure apparatus, or a so-called stepper. This exposure apparatus includes: a mask stage 210 for retaining a mask 201; a driving device 211 for driving the mask stage 210 to move or replace the mask 201; a wafer stage 220 for retaining a wafer 202; a moving mechanism 221 for moving the wafer stage 220; a driving device 222 for driving the moving mechanism 221; a reduction projection optical system 203; an illumination device 204; a detection device 240 for detecting the location of the wafer 202; and a control device 250 for controlling the illumination device 204, the driving devices 211 and 222 and the detection device 240.

The mask stage 210 is disposed above the wafer stage 220. The reduction projection optical system 203 is disposed between the mask stage 210 and the wafer stage 220. The illumination device 204 is disposed above the mask stage 210 and applies light for exposure to the mask 201.

The moving mechanism 221 is capable of moving the wafer stage 220 in X, Y and Z directions shown in FIG. 14 and capable of changing the angle of inclination of the wafer stage 220 with respect to the X-Y plane. The X direction and the Y direction are orthogonal to each other and are both orthogonal to the direction of optical axis of the reduction projection optical system 203. The Z direction is parallel to the direction of optical axis of the reduction projection optical system 203. The detection device 240 detects the location of the surface of the wafer 202 and the angle of inclination of the surface of the wafer 202 with respect to the X-Y plane.

The control device 250 has a microprocessor unit (MPU), read only memory (ROM) and random access memory (RAM).

When exposing the wafer 202 using this exposure apparatus, a plurality of pattern projection regions are defined on the surface of the wafer 202. A ray bundle emitted from the illumination device 204 passes through the mask 201 and is applied to one of the pattern projection regions by the reduction projection optical system 203. The mask pattern of the mask 201 is thereby projected onto the one of the pattern projection regions through the reduction projection optical system 203, so that the process of exposing the one of the pattern projection regions is performed. After performing the process of exposing the one of the pattern projection regions based on the mask pattern, the exposure apparatus moves the wafer 202 in the X or Y direction, and performs the same exposure process for a next one of the pattern projection regions.

In the step of forming the frame 108 of the present embodiment, first, a photoresist layer is formed on the insulating layer 106 to cover the plurality of pre-semiconductor-chip portions 30P of the structure shown in FIG. 6. In the present embodiment, the photoresist layer is negative-working. In the negative-working photoresist layer, the areas irradiated with light become insoluble in a developing solution while the unirradiated areas are soluble in the developing solution. Next, the photoresist layer is patterned by photolithography to thereby form the frame 108. When forming the frame 108, the exposure apparatus shown in FIG. 14 is used for exposing the photoresist layer. In this case, the structure of FIG. 6 with the photoresist layer formed thereon serves as the wafer 202 of FIG. 14. A plurality of pattern projection regions are defined on portions of the surface of the photoresist layer that correspond to the plurality of pre-semiconductor-chip portions 30P. The size of each pattern projection region is designed to be slightly larger than the top surface of the pre-semiconductor-chip portion 30P so as to cover the area where the electrodes 32 are to be formed. The location information on the normally functioning and malfunctioning pre-semiconductor-chip portions 30P in each pre-substructure wafer 101 obtained by the wafer sort test is input to and held by the control device 250 when the photoresist layer of the wafer 202 corresponding to the pre-substructure wafer 101 is exposed. The control device 250 can replace the mask 201 based on the location information.

The exposure step of exposing the photoresist layer for forming the frame 108 of the present embodiment will now be described with reference to the flow chart of FIG. 15. In this exposure step, the photoresist layer is exposed such that a latent image corresponding to the plurality of electrodes 32 is formed on a portion of the photoresist layer corresponding to a normally functioning pre-semiconductor-chip portion 30P whereas any latent image corresponding to an electrode connected to a malfunctioning pre-semiconductor-chip portion 30P and having an end face located at the at least one of the side surfaces of the main body 2 on which the wiring 3 is disposed is not formed on a portion of the photoresist layer corresponding to the malfunctioning pre-semiconductor-chip portion 30P. In this exposure step, first, among of the plurality of the pattern projection regions that correspond to the plurality of pre-semiconductor-chip portions 30P, a pattern projection region that corresponds to a first pre-semiconductor-chip portion 30P is selected to be exposed by the exposure apparatus of FIG. 14 (Step S101). Next, the control device 250 judges whether the pre-semiconductor-chip portion 30P corresponding to the selected pattern projection region is a normally functioning one or not (Step S102).

If the pre-semiconductor-chip portion 30P is judged as a normally functioning one (Y) in Step S102, the portion of the photoresist layer corresponding to the normally functioning pre-semiconductor-chip portion 30P is exposed in a pattern corresponding to the plurality of electrodes 32 (hereinafter referred to as an electrode pattern) through a mask 201 having the electrode pattern (Step S103). Specifically, the electrode pattern is configured to disallow light to be applied to an area of the pattern projection region where to form the grooves 108a to later accommodate the electrodes 32 and to allow light to be applied to the remaining area of the pattern projection region. As a result of this exposure, a latent image corresponding to the plurality of electrodes 32 is formed on the portion of the photoresist layer corresponding to the normally functioning pre-semiconductor-chip portion 30P. To be more specific, in the portion of the photoresist layer corresponding to a normally functioning pre-semiconductor-chip portion 30P, the area where to form the grooves 108a to later accommodate the electrodes 32 is soluble in a developing solution while the remaining area becomes insoluble in the developing solution upon this exposure.

If the pre-semiconductor-chip portion 30P is judged as a malfunctioning one (N) in Step S102, the portion of the photoresist layer corresponding to the malfunctioning pre-semiconductor-chip portion 30P is subjected to an overall exposure through a mask 201 that entirely passes light, or without using a mask 201 (Step S104). As a result, any latent image corresponding to an electrode connected to the malfunctioning pre-semiconductor-chip portion 30P and having an end face located at the at least one of the side surfaces of the main body 2 on which the wiring 3 is disposed is not formed on the portion of the photoresist layer corresponding to the malfunctioning pre-semiconductor-chip portion 30P. Specifically, the entire portion of the photoresist layer corresponding to the malfunctioning pre-semiconductor-chip portion 30P becomes insoluble in the developing solution. In the case where a layer portion 10 of the second type includes an electrode or wiring other than one connected to the malfunctioning semiconductor chip 30 and having an end face located at the at least one of the side surfaces of the main body 2 on which the wiring 3 is disposed, an exposure is performed in Step S104 such that a latent image corresponding to such an electrode or wiring is formed, instead of the overall exposure. In this case also, any latent image corresponding to an electrode connected to the malfunctioning pre-semiconductor-chip portion 30P and having an end face located at the at least one of the side surfaces of the main body 2 on which the wiring 3 is disposed is not formed on the portion of the photoresist layer corresponding to the malfunctioning pre-semiconductor-chip portion 30P.

After the Step S103 or S104 is performed, the control device 250 judges whether the pattern projection region having undergone the exposure in Step S103 or S104 is the region corresponding to the last pre-semiconductor-chip portion 30P (Step S105). If the pattern projection region is judged as corresponding to the last pre-semiconductor-chip portion 30P (Y), the exposure step is finished. If the pattern projection region is judged as not corresponding to the last pre-semiconductor-chip portion 30P (N), a pattern projection region corresponding to a next pre-semiconductor-chip portion 30P is selected to be exposed (Step S106) and the process starting from Step S102 is repeated.

Figure 15:
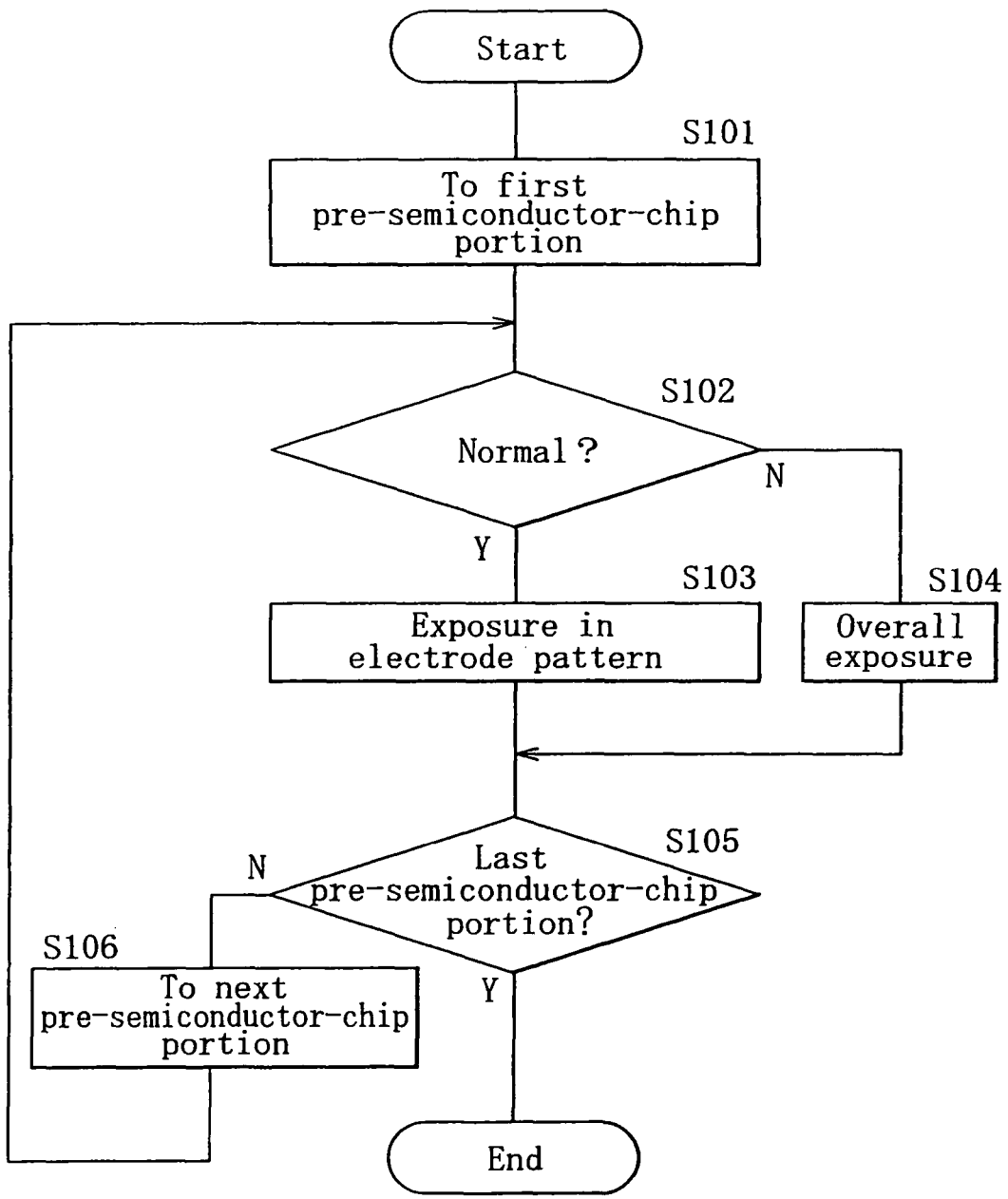
FIG. 15 is a flow chart showing an exposure step for forming a plurality of electrodes in the manufacturing method for the layered chip package of the first embodiment of the invention.
Figure 16:
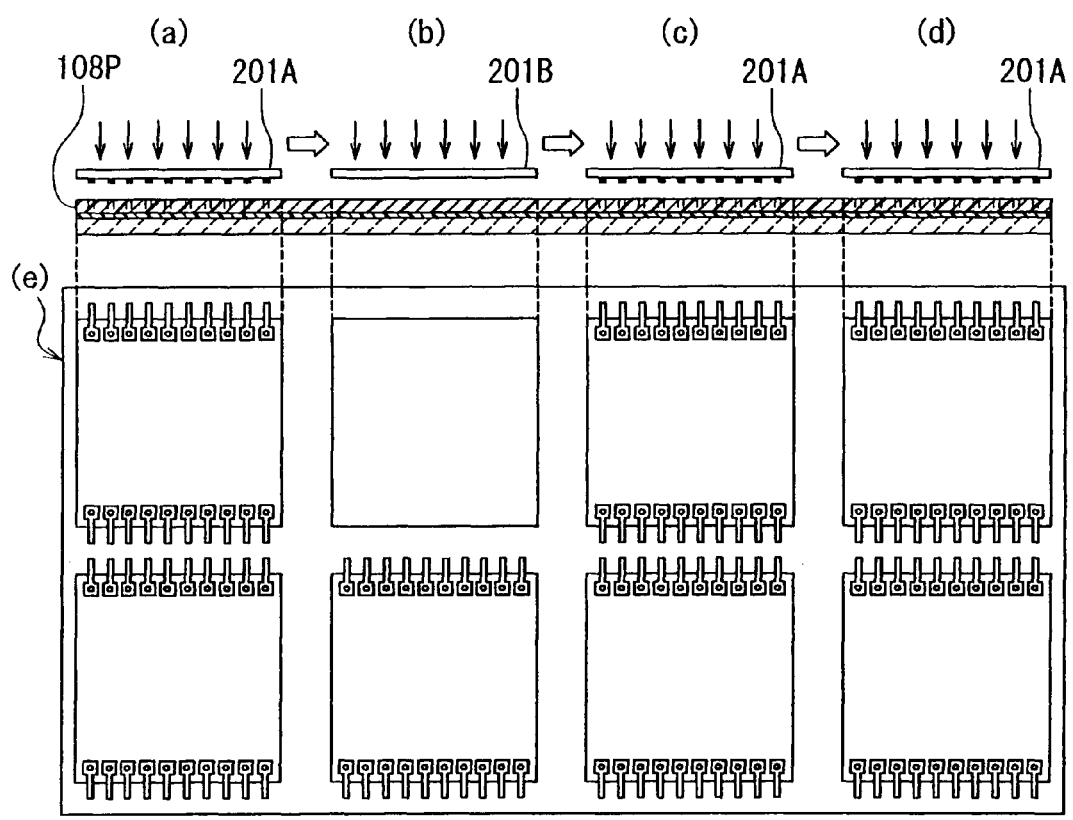
FIG. 16 is an illustrative view showing the exposure step for forming the plurality of electrodes in the manufacturing method for the layered chip package of the first embodiment of the invention.

FIG. 16 is an illustrative view showing the exposure step of FIG. 15. Reference sign 108P in FIG. 16 indicates the photoresist layer to be used for forming the frame 108. Portions (a), (b), (c) and (d) of FIG. 16 indicate regions for which Step S103 or S104 is to be performed. In the example of FIG. 16, Step S103 or S104 is performed in the order of the regions (a), (b), (c) and (d). For the regions (a), (c) and (d), the corresponding pre-semiconductor-chip portions 30P have been judged as normally functioning ones in Step S102 and consequently the portions of the photoresist layer 108P corresponding to those normally functioning pre-semiconductor-chip portions 30P are each exposed in the electrode pattern through a mask 201A having the electrode pattern. For the region (b), the corresponding pre-semiconductor-chip portion 30P has been judged as a malfunctioning one in Step S102 and consequently the portion of the photoresist layer 108P corresponding to the malfunctioning pre-semiconductor-chip portion 30P is subjected to an overall exposure through a mask 201B that entirely passes light (or without using any mask 201). The portion (e) of FIG. 16 shows the plane geometry of the latent image formed on the photoresist layer 108P by exposure.

Figure 17:
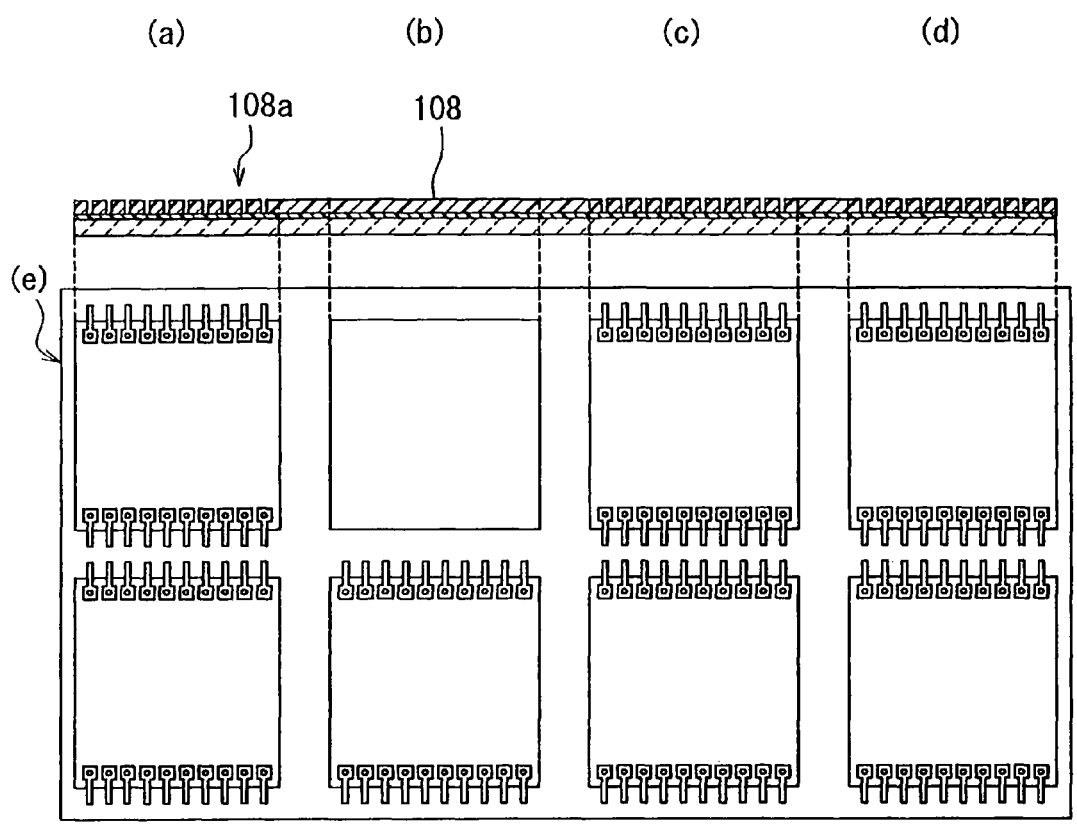
FIG. 17 is an illustrative view showing a development step that follows the exposure step of FIG. 16.

After the exposure step described above, the photoresist layer 108P is developed with a developing solution and the frame 108 is thereby formed. FIG. 17 shows the frame 108 formed by development. Regions (a), (b), (c) and (d) of FIG. 17 correspond to the regions (a), (b), (c) and (d) of FIG. 16. In FIG. 17, in the regions (a), (c) and (d) the grooves 108a are formed in the frame 108, Whereas in the region (b), grooves 108a are not formed in the frame 108. The portion (e) of FIG. 17 shows the plane geometries of the grooves 108a.

Figure 18:
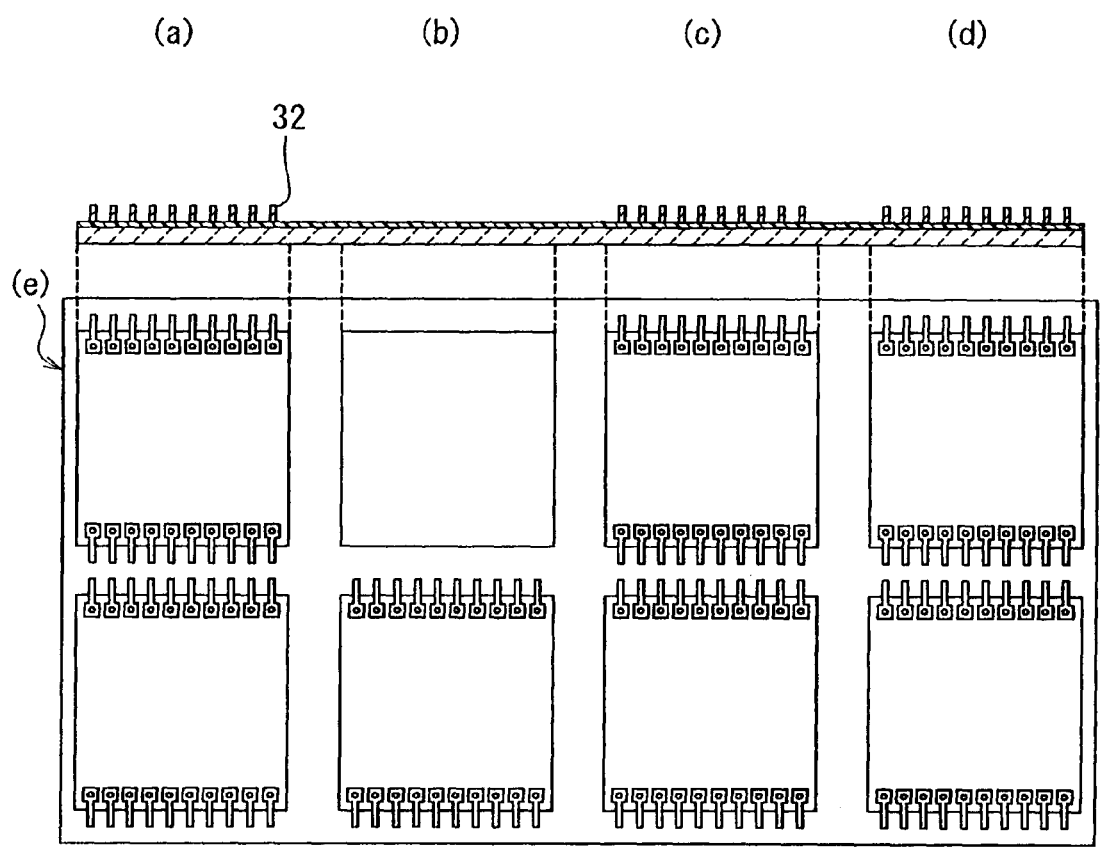
FIG. 18 is an illustrative view showing a plating step that follows the development step of FIG. 17.

Next, the electrodes 32 are formed in the grooves 108a of the frame 108 by, for example, plating, and then the frame 108 is removed. FIG. 18 shows the electrodes 32 thus formed. Regions (a), (b), (c) and (d) of FIG. 18 correspond to the regions (a), (b), (c) and (d) of FIG. 16. In FIG. 18 the electrodes 32a are formed in the regions (a), (c) and (d), whereas in the region (b) there are not formed any electrode connected to the pre-semiconductor-chip portion 30P. The portion (e) of FIG. 18 shows the plane geometries of the electrodes 32a.

Figure 19:
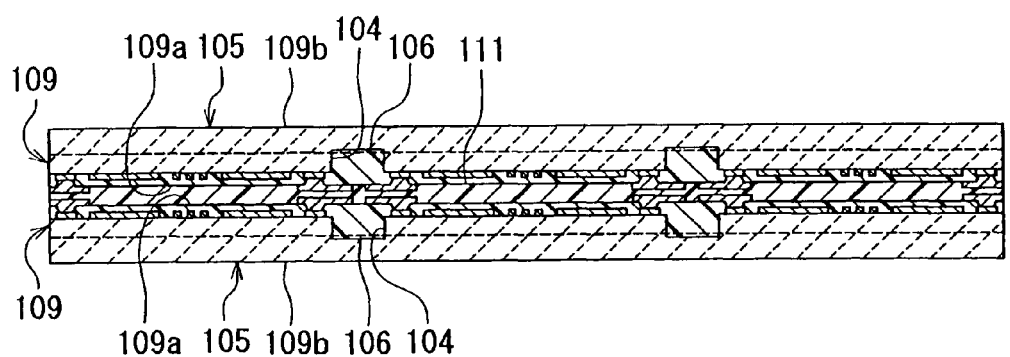
FIG. 19 is a cross-sectional view of a portion of a stack of layers fabricated in a step that follows the step of FIG. 8.

Steps following the formation of the electrodes 32 will now be described. FIG. 19 shows a step that follows the step of FIG. 8. In this step, two pre-polishing substructures 109 are bonded to each other with an insulating adhesive such that their respective first surfaces 109a face toward each other. A stack including the two pre-polishing substructures 109 is thereby fabricated. An insulating layer 111 formed by the adhesive covers the electrodes 32 and will become part of the insulating portion 31. It is preferred that the insulating layer 111 be transparent. Hereinafter, the lower one of the two pre-polishing substructures 109 shown in FIG. 19 will be called a first pre-polishing substructure 109. The pre-substructure wafer 101 serving as a basis for fabricating the first pre-polishing substructure 109 will be hereinafter called a first pre-substructure wafer 101. The upper one of the two pre-polishing substructures 109 shown in FIG. 19 will be hereinafter called a second pre-polishing substructure 109. The pre-substructure wafer 101 serving as a basis for fabricating the second pre-polishing substructure 109 will be hereinafter called a second pre-substructure wafer 101.

Next, both surfaces of the stack shown in FIG. 19, that is, the second surface 109b of the first pre-polishing substructure 109 and the second surface 109b of the second pre-polishing substructure 109, are polished. This polishing is performed until the plurality of grooves 104 become exposed. In FIG. 19 the broken lines indicate the positions of the second surfaces 109b after the polishing.

Figure 20:
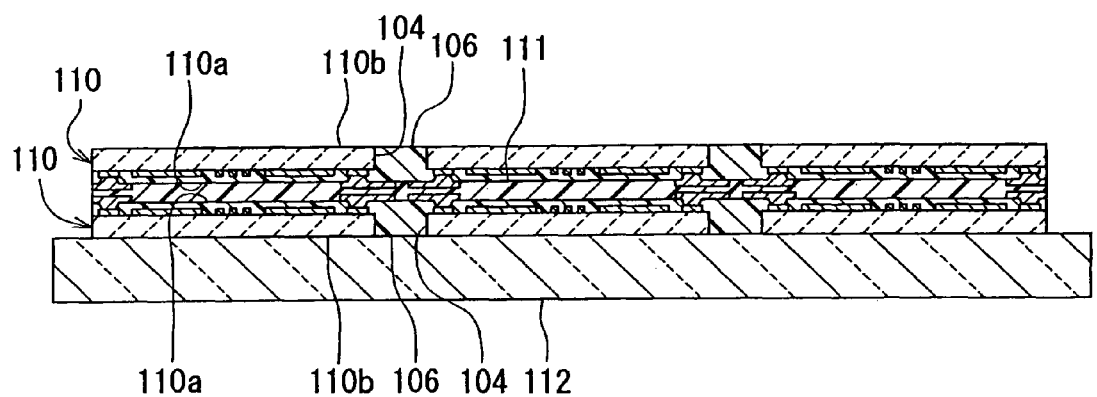
FIG. 20 is a cross-sectional view of a portion of a stack of layers fabricated in a step that follows the step of FIG. 19.

FIG. 20 shows the stack having undergone the polishing of both surfaces as described above. As a result of polishing the second surface 109b of the first pre-polishing substructure 109, the first pre-polishing substructure 109 is thinned by the polishing and thereby a substructure 110 is formed. This substructure 110 will be hereinafter called a first substructure 110. Similarly, as a result of polishing the second surface 109b of the second pre-polishing substructure 109, the second pre-polishing substructure 109 is thinned by the polishing and thereby a substructure 110 is formed. This substructure 110 will be hereinafter called a second substructure 110. Each of the first and second substructures 110 has a thickness of, for example, 30 to 100 μm. Each substructure 110 has a first surface 110a corresponding to the first surface 109a of the pre-polishing substructure 109, and a second surface 110b opposite to the first surface 110a. The second surface 110b is the polished surface.

In the step of polishing both surfaces of the stack including the two substructures 109 as above, after one of the two surfaces of the stack is polished, a plate-shaped jig 112 shown in FIG. 20 is bonded to the polished surface and then the other surface is polished. Bonding the jig 112 to the polished surface of the stack facilitates handling of the stack and prevents the stack from being damaged in a subsequent step. If the insulating layers 106 and 111 are transparent, using a transparent jig such as an acrylic plate or a glass plate as the jig 112 allows the alignment marks 107 of the two substructures 110 included in the stack to be visible through the jig 112 and the insulating layers 106 and 111, all of which are transparent. As a result, as will be described later, when two or more of the stacks of FIG. 20 are stacked on each other, it is possible to perform alignment of the stacks through the use of the alignment marks 107.

Figure 21:
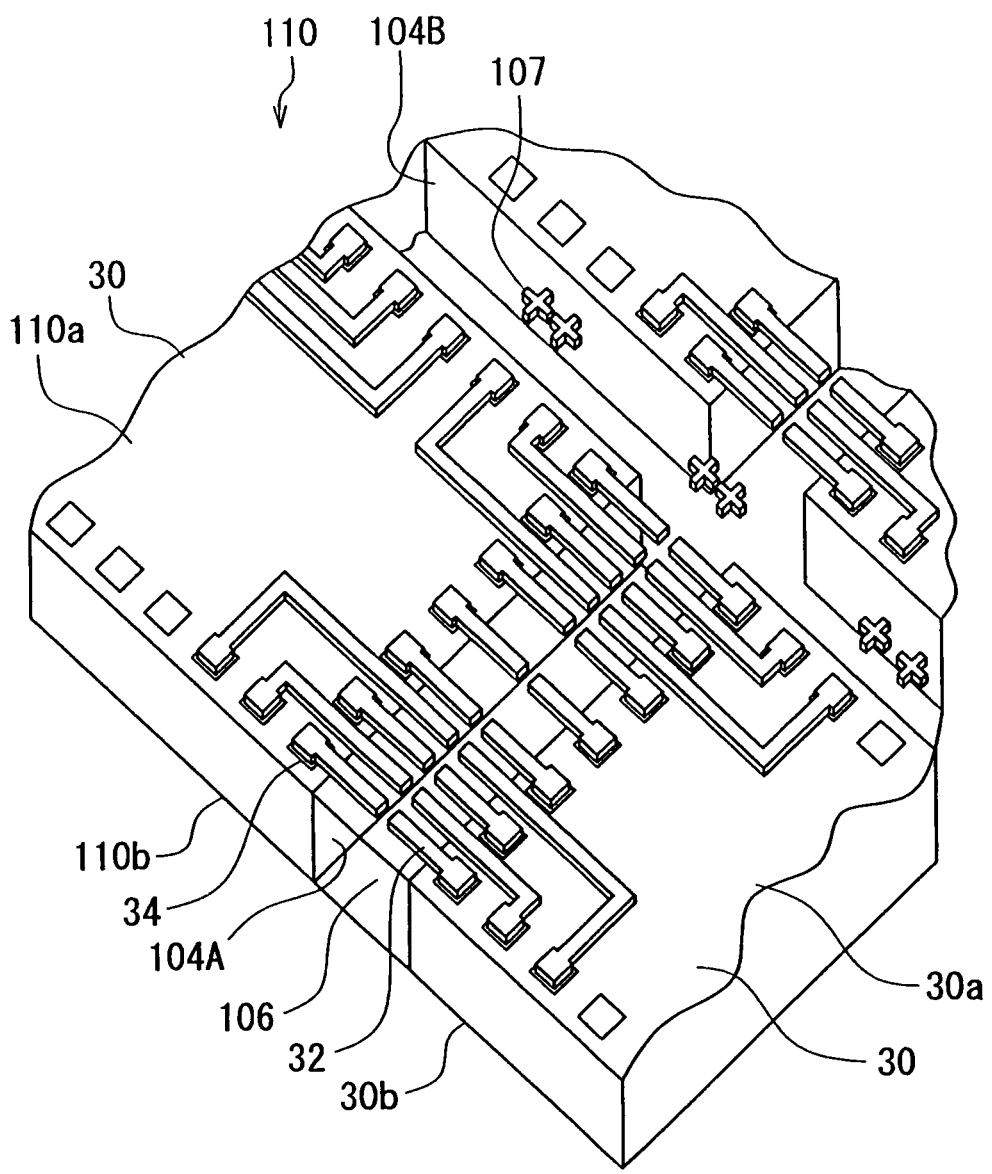
FIG. 21 is a perspective view of a portion of a substructure fabricated in the step of FIG. 20.

FIG. 21 shows a portion of each substructure 110 fabricated in the step of FIG. 20. As previously described, by polishing the second surface 109b of the pre-polishing substructure 109 until the grooves 104 become exposed, the plurality of pre-semiconductor-chip portions 30P are separated from each other and thereby become the semiconductor chips 30. The first surface 30a of each semiconductor chip 30 corresponds to the first surface 100a of the semiconductor wafer 100, and the second surface 30b of each semiconductor chip 30 corresponds to the second surface 100b of the semiconductor wafer 100. The plurality of terminals 34 of each semiconductor chip 30 are disposed on the first surface 30a.

Figure 22:
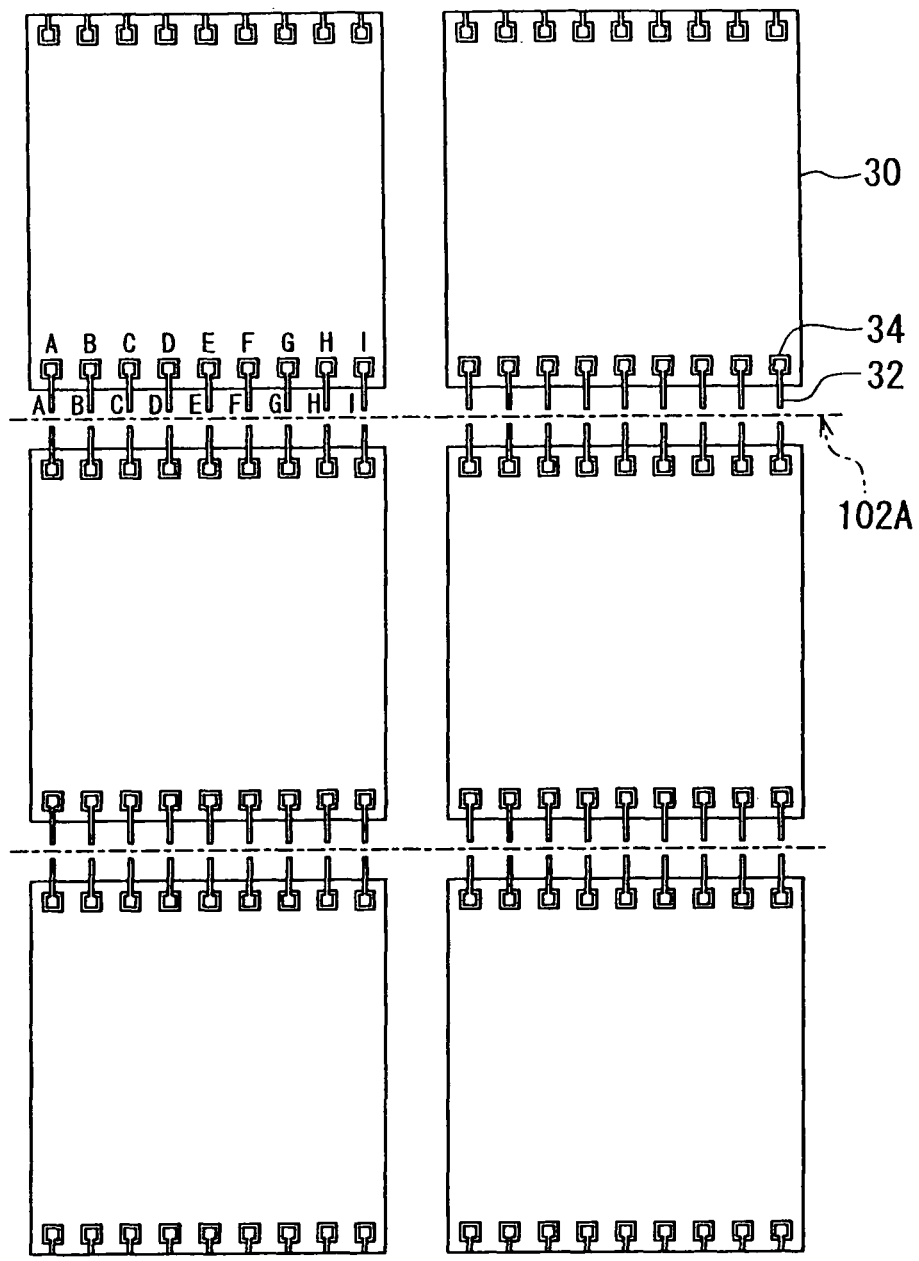
FIG. 22 is a plan view showing an example of layouts of a plurality of terminals and a plurality of electrodes of a first substructure shown in FIG. 20.
Figure 23:
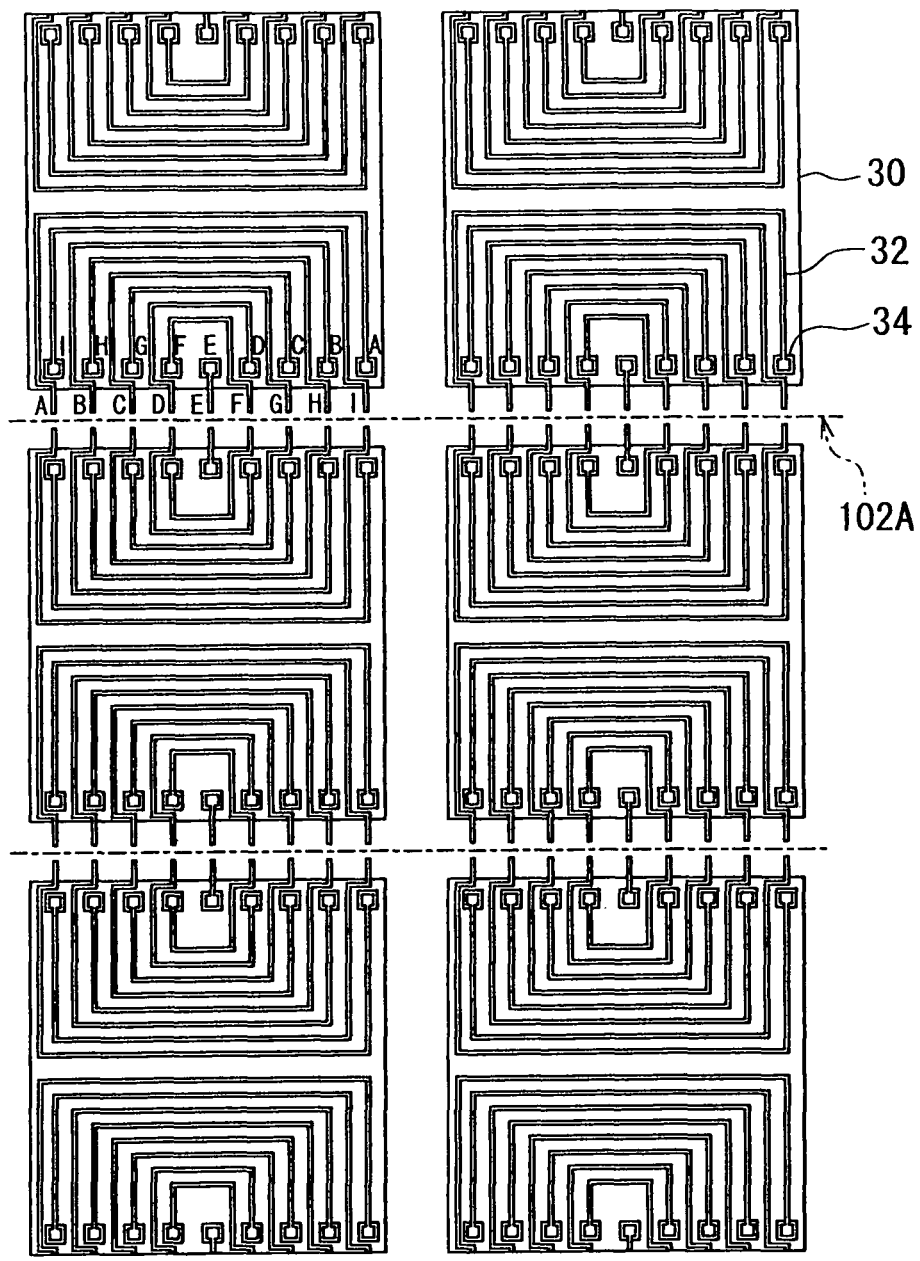
FIG. 23 is a plan view showing an example of layouts of a plurality of terminals and a plurality of electrodes of a second substructure shown in FIG. 20.

Reference will now be made to FIG. 22 and FIG. 23 to describe an example of the layout of the terminals 34 and the electrodes 32 in the first substructure 110 and the layout of the terminals 34 and the electrodes 32 in the second substructure 110. FIG. 22 shows the terminals 34 and the electrodes 32 of the first substructure 110 as seen from the first surface 110a of the first substructure 110. FIG. 23 shows the terminals 34 and the electrodes 32 of the second substructure 110 as seen from the second surface 110b of the second substructure 110. The substructures 110 will be cut later along the scribe lines 102A shown in FIG. 22 and FIG. 23, and this will form the end face of each of the electrodes 32 located at one of the side surfaces of the main body 2.

Each of the semiconductor chips 30 included in the first substructure 110 shown in FIG. 22 will be hereinafter called a first semiconductor chip 30. Each of the semiconductor chips 30 included in the second substructure 110 shown in FIG. 23 will be hereinafter called a second semiconductor chip 30.

As shown in FIG. 22, the first semiconductor chip 30 includes a plurality of first terminals 34 aligned in a predetermined order. Here, of the plurality of first terminals 34, attention is focused on nine terminals aligned along one side of the first surface 30a of the semiconductor chip 30, as shown in FIG. 22. In FIG. 22 the nine terminals are indicated with reference characters A to I. In the first semiconductor chip 30, the terminals A to I are aligned in a row in the order of A to I in the direction from left to right in FIG. 22.

The second semiconductor chip 30 shown in FIG. 23 includes a plurality of second terminals 34 aligned in a predetermined order in correspondence with the first terminals 34 of the first semiconductor chip 30 of FIG. 22. In particular, the second semiconductor chip 30 includes terminals A to I that respectively correspond to the terminals A to I of the first semiconductor chip 30 and that are aligned similarly to the terminals A to I of the first semiconductor chip 30. As seen from the first surface 30a of the semiconductor chip 30, the order in which the terminals A to I are aligned is the same between the first and second semiconductor chips 30. However, under the condition in which the first and second semiconductor chips 30 are disposed such that their respective first surfaces 30a face toward each other, as seen in one direction, such as in the direction from the second surface 30b of the second semiconductor chip 30, the order in which the terminals A to I of the second semiconductor chip 30 are aligned is the reverse of the order in which the terminals A to I of the first semiconductor chip 30 are aligned, as shown in FIG. 22 and FIG. 23.

Here, of the end faces of the plurality of electrodes 32 to be formed later at the positions of the scribe lines 102A shown in FIG. 22 and FIG. 23, those corresponding to the terminals A to I of the semiconductor chip 30 are also indicated with reference characters A to I. In the first substructure 110, as seen in one direction, the end faces A to I of the electrodes 32 to be formed at the positions of the scribe lines 102A are aligned in the same order as that in which the corresponding terminals A to I are aligned, as shown in FIG. 22. In other words, the plurality of electrodes 32 of the first substructure 110 are formed in such a pattern that the order in which the end faces A to I of the electrodes 32 are aligned is the same as the order in which the corresponding terminals A to I are aligned.

In contrast, in the second substructure 110, as seen in one direction, the end faces A to I of the electrodes 32 to be formed at the positions of the scribe lines 102A are aligned in the reverse order to that in which the corresponding terminals A to I are aligned, as shown in FIG. 23. In other words, the plurality of electrodes 32 of the second substructure 110 are formed in such a pattern that the order in which the end faces A to I of the electrodes 32 are aligned is the reverse of the order in which the corresponding terminals A to I are aligned.

In the layered chip package 1 fabricated by using the layered substructure including the first and second substructures 110 shown in FIG. 22 and FIG. 23, as seen in one direction, the order in which the terminals A to I of the second semiconductor chip 30 are aligned is the reverse of the order in which the terminals A to I of the first semiconductor chip 30 are aligned. The end faces of electrodes 32 that are located at one side surface of the main body 2 and connected to the terminals A to I of the first semiconductor chip 30 are aligned in the same order as that in which the corresponding terminals A to I are aligned, whereas the end faces of electrodes 32 that are located at one side surface of the main body 2 and connected to the terminals A to I of the second semiconductor chip 30 are aligned in the reverse order to that in which the corresponding terminals A to I are aligned. As a result, at one side surface of the main body 2, the end faces of electrodes 32 that are connected to the terminals A to I of the first semiconductor chip 30 and the end faces of electrodes 32 that are connected to the terminals A to I of the second semiconductor chip 30 are aligned in the same order.

A case will now be considered where, in a pair of layer portions included in the layered chip package 1, the first and second semiconductor chips 30 having the terminals 34 aligned in the same manner are disposed such that the respective first surfaces 30a face toward each other and corresponding terminals 34 of the first and second semiconductor chips 30 are connected to each other. In this case, according to the example of the layouts of the terminals 34 and the electrodes 32 of the first and second substructures 110 shown in FIG. 22 and FIG. 23, the end faces of electrodes 32 that are connected to the terminals 34 of the first semiconductor chip 30 and the end faces of electrodes 32 that are connected to the terminals 34 of the second semiconductor chip 30 are aligned in the same order at one side surface of the main body 2. This makes it possible to easily connect the corresponding terminals 34 of the first and second semiconductor chips 30 to each other through the wiring 3.

While the foregoing description has been made concerning the terminals 34 aligned along one side of the first surface 30a of the semiconductor chip 30 shown in each of FIG. 22 and FIG. 23 and the electrodes 32 connected to those terminals 34; the same applies to other terminals 34 aligned along the opposite side to the foregoing side and electrodes 32 connected to those terminals 34.

Figure 24:
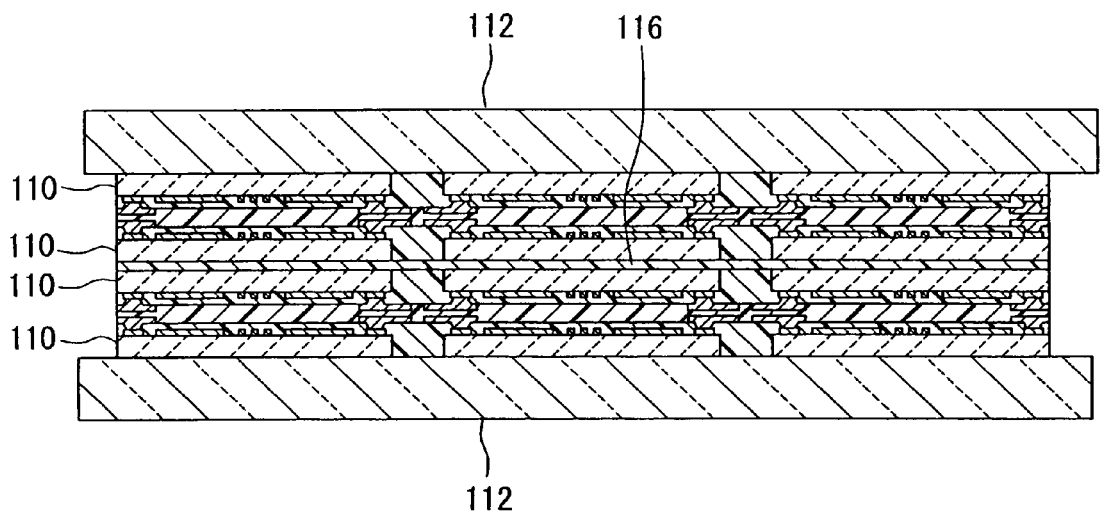
FIG. 24 is a cross-sectional view of a portion of a stack of layers fabricated in a step that follows the step of FIG. 20.

FIG. 24 shows a step that follows the step of FIG. 20. In this step, two stacks each of which includes two substructures 110 and is bonded to a jig 112 as shown in FIG. 20 are prepared, and the two stacks are bonded to each other with an adhesive to thereby fabricate a stack including four substructures 110. Reference numeral 116 in FIG. 24 indicates an adhesive layer formed by the adhesive. Here, as previously mentioned, if the insulating layers 106 and 111 are transparent, using a transparent jig such as an acrylic plate or a glass plate as the jig 112 allows the alignment marks 107 of the two substructures 110 included in each stack to be visible through the jig 112 and the insulating layers 106 and 111, all of which are transparent. As a result, as will be described later, when the two stacks each including two substructures 110 are bonded to each other, it is possible to perform alignment of the stacks through the use of the alignment marks 107.

Figure 25:
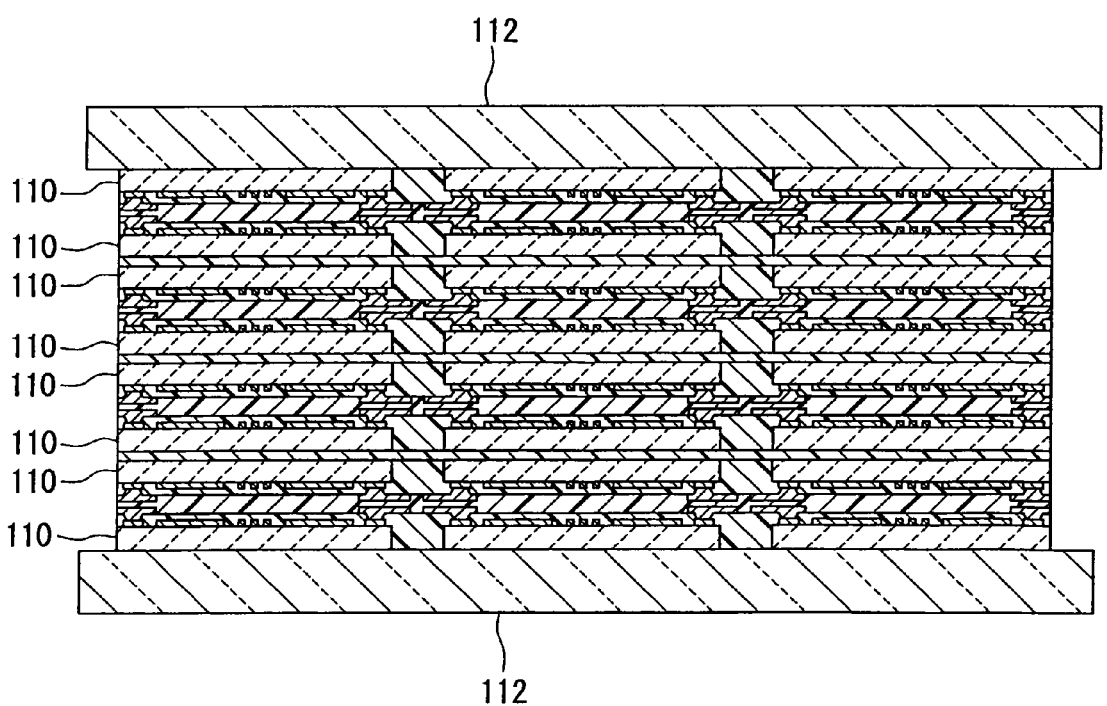
FIG. 25 is a cross-sectional view of a portion of a stack of layers fabricated in a step that follows the step of FIG. 24.

FIG. 25 shows a step that follows the step of FIG. 24. In this step, two stacks each of which includes the four substructures 110 as shown in FIG. 24 are prepared, and the two stacks are bonded to each other with an adhesive to thereby fabricate a stack including eight substructures 110.

Figure 26:
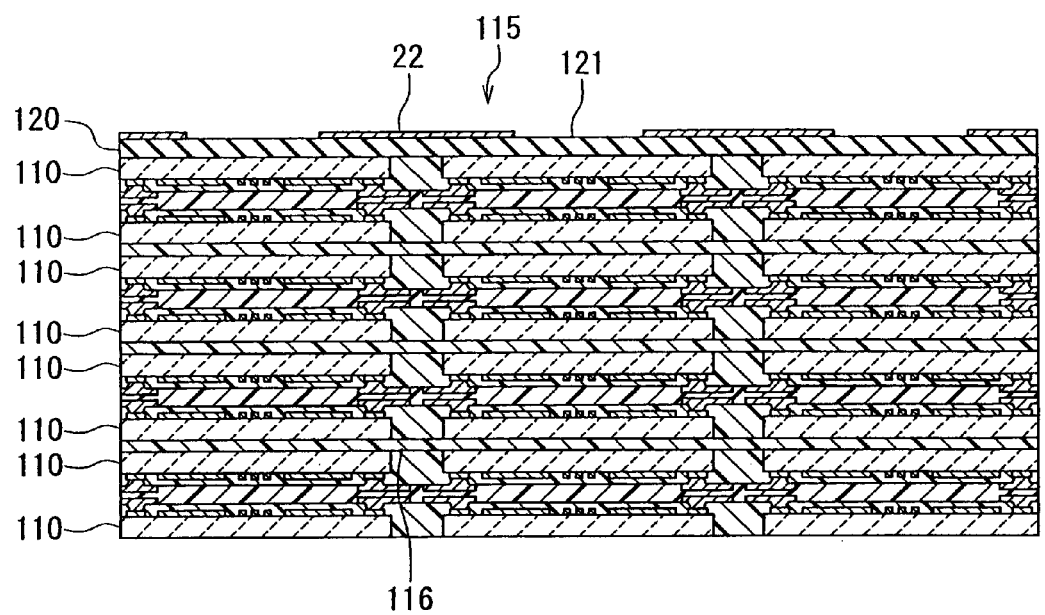
FIG. 26 is a cross-sectional view of a portion of a layered substructure fabricated in a step that follows the step of FIG. 25.
Figure 27:
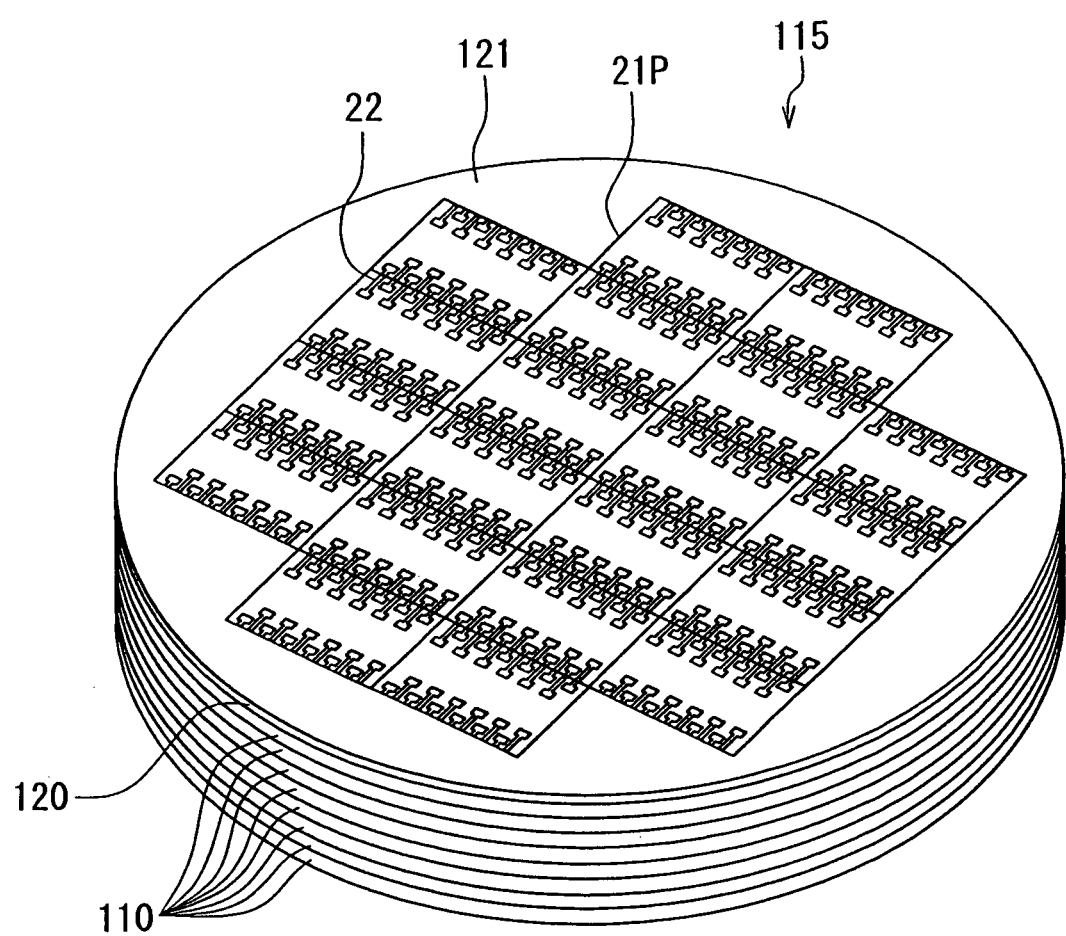
FIG. 27 is a perspective view of the layered substructure fabricated in the step that follows the step of FIG. 25.

FIG. 26 and FIG. 27 show a step that follows the step of FIG. 25. In this step, a layered substructure 115 is fabricated by stacking a terminal wafer 120 on the uppermost one of the eight substructures 110 included in the stack fabricated in the step of FIG. 25. The terminal wafer 120 has a wafer main body 121 that is plate-shaped and formed of an insulating material such as a resin or ceramic. The wafer main body 121 includes a plurality of pre-terminal-layer-body portions 21P that will be separated from each other later to thereby become the terminal layer main bodies 21. The terminal wafer 120 further includes a plurality of groups of pad-shaped terminals 22 disposed on the top surface of the wafer main body 121. One each group of pad-shaped terminals 22 is disposed in each pre-terminal-layer-body portion 21P. FIG. 26 and FIG. 27 show an example in which, at the boundaries between every two adjacent pre-terminal-layer-body portions 21P, pad-shaped terminals 22 disposed in one of the two adjacent pre-terminal-layer-body portions 21P are coupled to those disposed in the other of the two adjacent pre-terminal-layer-body portions 21P. However, it is not necessarily required that pad-shaped terminals 22 disposed in one of two adjacent pre-terminal-layer-body portions 21P be coupled to those disposed in the other of the two adjacent pre-terminal-layer-body portions 21P. The wafer main body 121 may be transparent. In this case, alignment marks may be provided on the top surface of the wafer main body 121 at the positions of the boundaries between every two adjacent pre-terminal-layer-body portions 21P.

In the present embodiment, the step of fabricating the layered substructure 115 includes the steps of: fabricating the first pre-substructure wafer 101; fabricating the second pre-substructure wafer 101; fabricating the first pre-polishing substructure 109 by using the first pre-substructure wafer 101; fabricating the second pre-polishing substructure 109 by using the second pre-substructure wafer 101; bonding the first pre-polishing substructure 109 and the second pre-polishing substructure 109 to each other such that the respective first surfaces 109a of the first and second pre-polishing substructures 109 face toward each other; and polishing the respective second surfaces 109b of the first pre-polishing substructure 109 and the second pre-polishing substructure 109 in the bonded state.

Each of the first and second pre-substructure wafers 101 is fabricated through the step described with reference to FIG. 4. Each of the first and second pre-polishing substructures 109 is fabricated through the steps described with reference to FIG. 5 to FIG. 8. Through the step of polishing the respective second surfaces 109b of the first pre-polishing substructure 109 and the second pre-polishing substructure 109 in the bonded state, a stack of the first substructure 110 and the second substructure 110 is obtained. The first substructure 110 is formed by thinning the first pre-polishing substructure 109 by the polishing, and the second substructure 110 is formed by thinning the second pre-polishing substructure 109 by the polishing.

If each pre-polishing substructure 109 is polished alone into the substructure 110, the substructure 110 becomes difficult to handle and also becomes susceptible to damage as the substructure 110 is made thin to a thickness of, for example, 30 to 100 µm. In addition, because of a difference in thermal expansion coefficient between the semiconductor chip 30 and the insulating layer 106 in the substructure 110, the substructure 110 will become curved as it becomes thin. This also makes it difficult to handle the substructure 110 and makes the substructure 110 susceptible to damage.

According to the present embodiment, the first pre-polishing substructure 109 and the second pre-polishing substructure 109 are bonded to each other such that their respective first surfaces 109a face toward each other, and the respective second surfaces 109b of the first pre-polishing substructure 109 and the second pre-polishing substructure 109 in the bonded state are polished. This provides a stack of the first substructure 110 and the second substructure 110, wherein the first substructure 110 is formed by thinning the first pre-polishing substructure 109 by the polishing, and the second substructure 110 is formed by thinning the second pre-polishing substructure 109 by the polishing. The strength of the stack of the first and second substructures 110 is greater than that of each substructure 110 alone. Consequently, the present embodiment makes it easier to handle the first and second substructures 110 and makes the substructures 110 resistant to damage.

The present embodiment provides a stack of the first and second substructures 110 that are bonded to each other such that their respective first surfaces 110a face toward each other. If a stress that acts to curve the substructure 110 alone is present in each of the first and second substructures 110, it is possible, according to the present embodiment, to cancel out the stresses of the first and second substructures 110. Consequently, it is possible to maintain the flatness of the first and second substructures 110.

Figure 28:
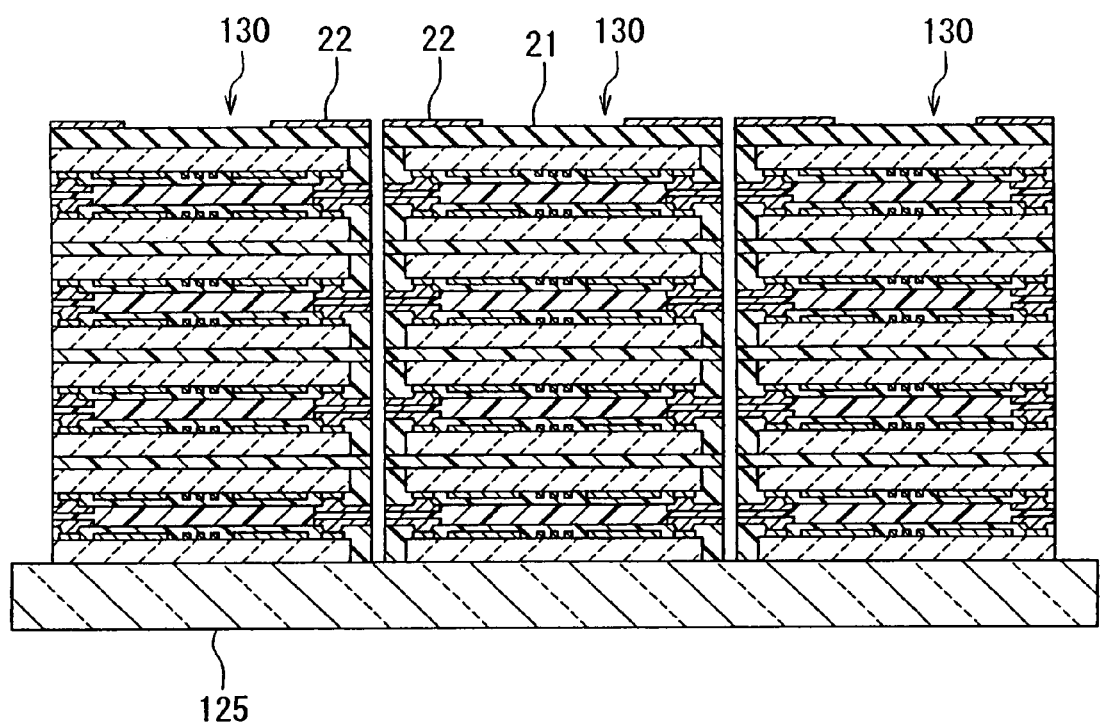
FIG. 28 is a cross-sectional view of a portion of a main body aggregate fabricated in a step that follows the step of FIG. 26.
Figure 29:
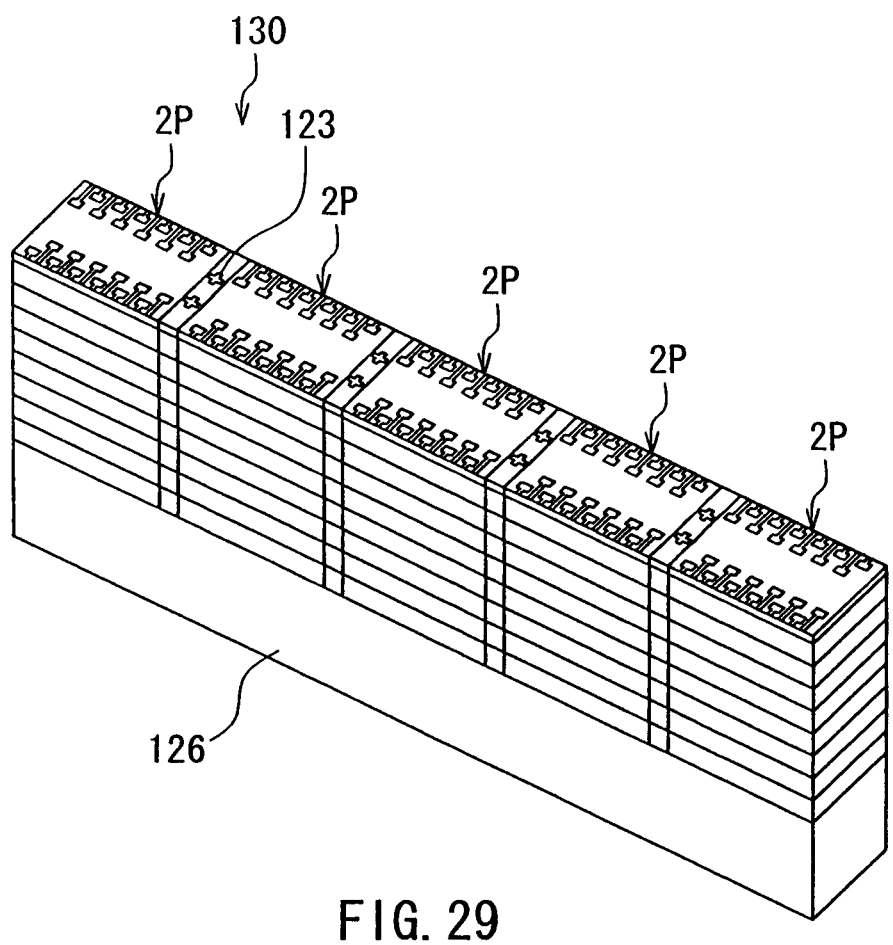
FIG. 29 is a perspective view of an example of the main body aggregate fabricated in the step of FIG. 28.
Figure 30:
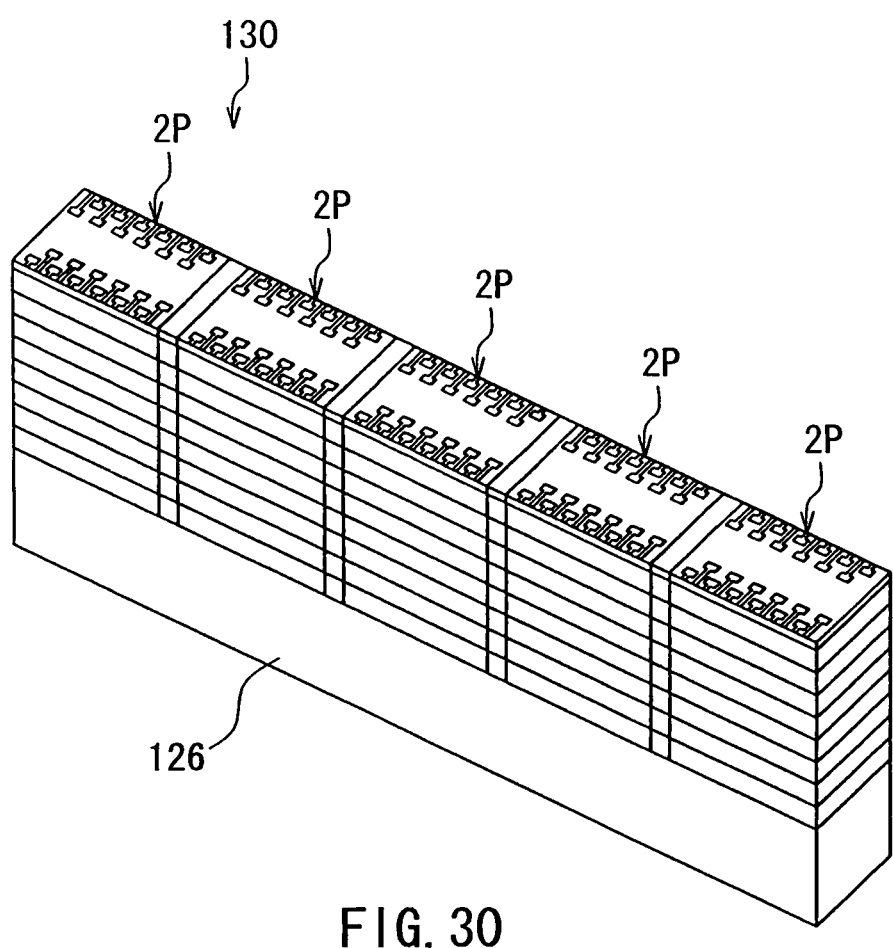
FIG. 30 is a perspective view of another example of the main body aggregate fabricated in the step of FIG. 28.

A description will now be made on the step of fabricating a plurality of layered chip packages 1 by using the layered substructure 115. In this step, first, as shown in FIG. 28, the layered substructure 115 is cut with a dicing saw along the first grooves 104A of FIG. 21 to provide a plurality of main body aggregates 130. FIG. 29 shows an example of each main body aggregate 130. FIG. 30 shows another example of each main body aggregate 130. As shown in FIG. 29 and FIG. 30, each main body aggregate 130 includes a plurality of pre-main-body portions 2P that are aligned in one direction that is orthogonal to the stacking direction of the plurality of layer portions 10 of the layered chip package 1. Each of the pre-main-body portions 2P will become the main body 2 later. The main body aggregate 130 shown in FIG. 29 is obtained by cutting the layered substructure 115 in which the wafer main body 121 of the terminal wafer 120 is transparent and alignment marks 123 are provided on the top surface of the wafer main body 121 at the positions of the boundaries between every adjacent two of the pre-terminal-layer-body portions 21P. The main body aggregate 130 shown in FIG. 30 is obtained by cutting the layered substructure 115 in which the alignment marks 123 are not provided on the top surface of the wafer main body 121. While FIG. 29 and FIG. 30 show that the main body aggregate 130 includes five pre-main-body portions 2P, the main body aggregate 130 can include any plural number of pre-main-body portions 2P.

The layered substructure 115 may be cut in the state of being bonded to a plate-shaped jig or to a wafer sheet that is typically used for dicing a wafer. FIG. 28 shows the example in which the layered substructure 115 has been cut in the state of being bonded to a plate-shaped jig 125. While FIG. 28 shows that the jig 125 is not cut, the jig 125 may be cut together with the layered substructure 115.

As shown in FIG. 29 and FIG. 30, the main body aggregate 130 has a top surface, a bottom surface and four side surfaces. A jig 126 may be bonded to the bottom surface of the main body aggregate 130. The jig 126 may be one obtained by cutting the jig 125 bonded to the layered substructure 115 when cutting the layered substructure 115.

Figure 31:
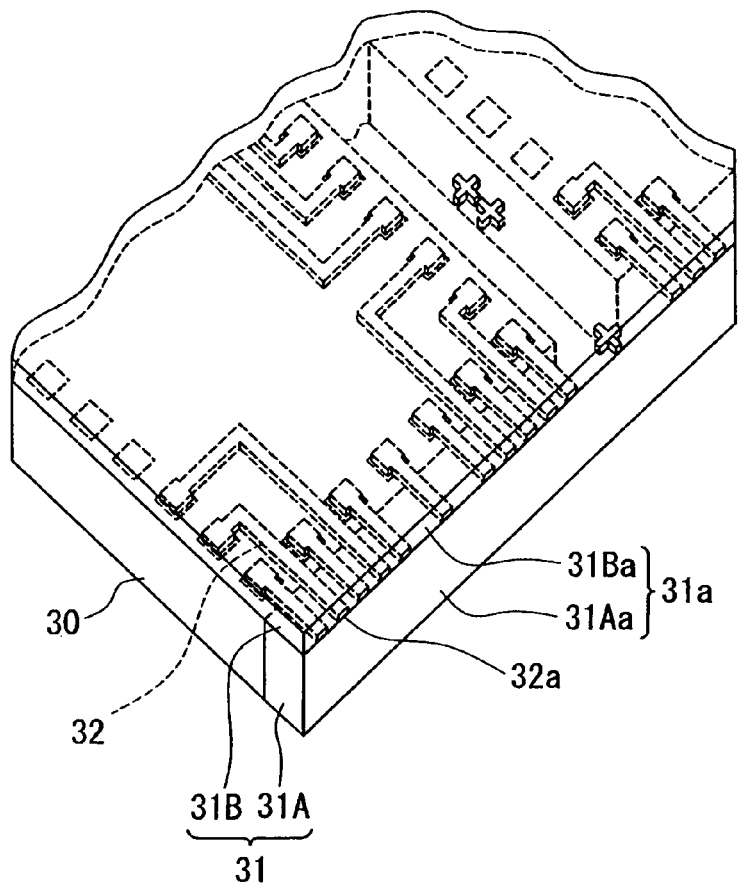
FIG. 31 is a perspective view of a portion of the main body aggregate fabricated in the step of FIG. 28.

In the step of cutting the layered substructure 115, the insulating layer 106 is cut such that a cut surface is formed along the direction in which the first groove 104A of FIG. 21 extends. FIG. 31 shows part of the main body aggregate 130 formed by cutting the layered substructure 115. As shown in FIG. 31, the insulating layer 106 becomes an insulating layer 31A by being cut. The insulating layer 31A is part of the insulating portion 31. In addition, part of the end face 31a of the insulating portion 31 is formed by the cut surface of the insulating layer 106, that is, a cut surface 31Aa of the insulating layer 31A.

In the step of cutting the layered substructure 115, the insulating layer 113 covering the electrodes 32 is also cut when the insulating layer 106 is cut. By being cut, the insulating layer 113 becomes an insulating layer 31B that is another part of the insulating portion 31. In addition, another part of the end face 31a of the insulating portion 31 is formed by the cut surface of the insulating layer 113, that is, a cut surface 31Ba of the insulating layer 31B.

In the step of cutting the layered substructure 115, by cutting the insulating layer 106, the end faces 32a of the plurality of electrodes 32 are exposed from the end face 31a of the insulating portion 31. The end faces 32a are surrounded by the insulating portion 31.

By cutting the layered substructure 115, the end faces 32a of the plurality of electrodes 32 appear at two of the four side surfaces of the main body aggregate 130, the two of the four side surfaces each being parallel to the direction in which the plurality of pre-main-body portions 2P are aligned. To be more specific, the end faces 32Aa of the plurality of electrodes 32A of all the layer portions 10 included in the main body aggregate 130 appear at one of the above two side surfaces of the main body aggregate 130, whereas the end faces 32Ba of the plurality of electrodes 32B of all the layer portions 10 included in the main body aggregate 130 appear at the other of the two side surfaces of the main body aggregate 130 that is opposite to the one mentioned above.

In the step of fabricating the plurality of layered chip packages 1, after cutting the layered substructure 115, polishing is performed on the two side surfaces of the main body aggregate 130 at which the end faces 32a of the electrodes 32 appear. Next, the wiring 3A, 3B is formed for each of the pre-main-body portions 2P of the main body aggregate 130. In the step of forming the wiring 3A, 3B, a plurality of main body aggregates 130 may be arranged in the stacking direction of the plurality of layer portions 10 and then the wiring 3A, 3B may be formed for the pre-main-body portions 2P of the plurality of main body aggregates 130 at a time. It is thereby possible to form the wiring 3A, 3B for a large number of pre-main-body portions 2P in a short time.

Figure 32:
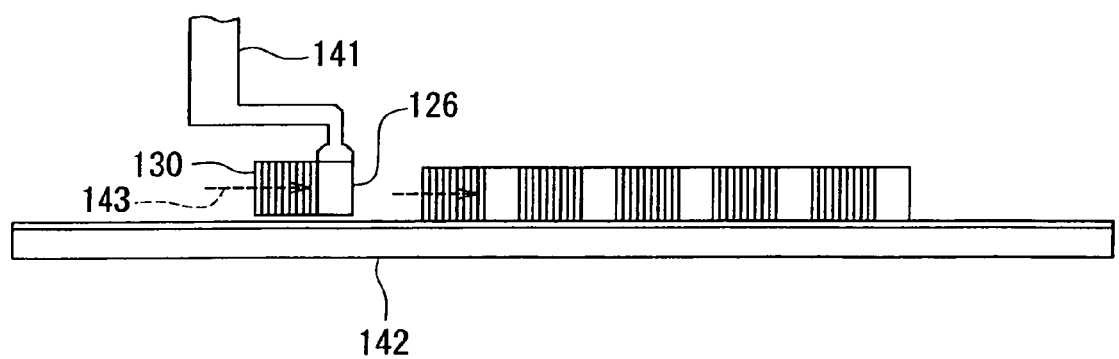
FIG. 32 is an illustrative view showing an example of a method of arranging a plurality of main body aggregates in the manufacturing method for the layered chip package of the first embodiment of the invention.
Figure 33:
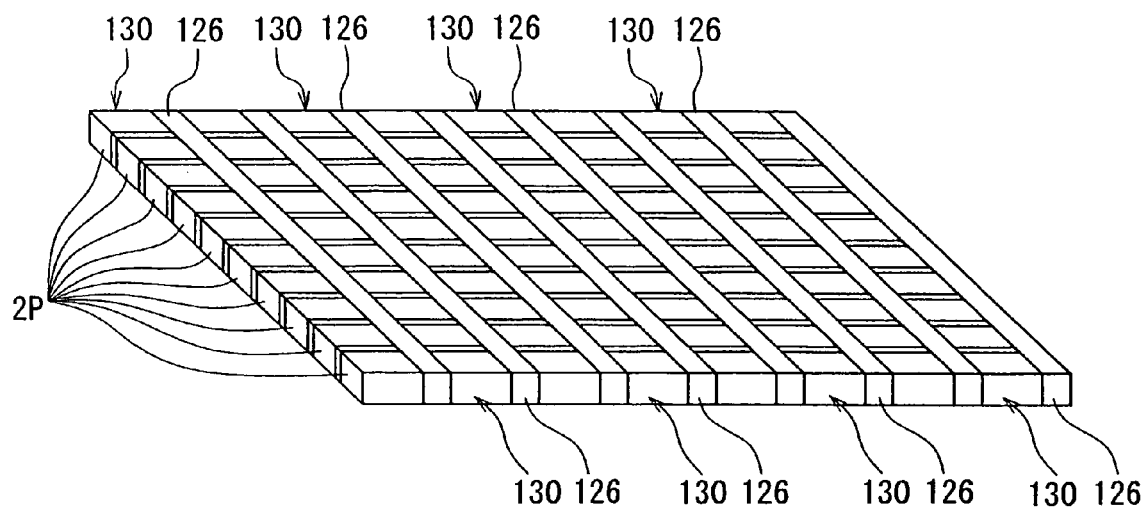
FIG. 33 is a perspective view showing a state in which a plurality of main body aggregates are arranged with a jig bonded to each of the main body aggregates.

FIG. 32 shows an example of a method of arranging a plurality of main body aggregates 130. In this example, a plurality of main body aggregates 130 each of which has the jig 126 bonded thereto are arranged on a table 142, while performing alignment, in the stacking direction of the plurality of layer portions 10 by using a chip bonding apparatus capable of recognizing and controlling the position of a chip. Reference numeral 141 in FIG. 32 indicates a head for holding a chip. In this example, each main body aggregate 130 with the jig 126 bonded thereto is held by the head 141 and placed to a desired position on the table 142 while recognizing and controlling the position of the main body aggregate 130. FIG. 33 shows a state in which a plurality of main body aggregates 130 each of which has the jig 126 bonded thereto are arranged in the stacking direction of the plurality of layer portions 10. The plurality of main body aggregates 130 thus arranged may be fixed by being bonded to each other such that they are easily separable.

When arranging the plurality of main body aggregates 130, the position of the edge of each main body aggregate 130 and/or the positions of the end faces 32a of the electrodes 32 that appear at the side surfaces of each main body aggregate 130 may be recognized with an image recognizer included in the chip bonding apparatus. It is thereby possible to recognize and control the position of each main body aggregate 130.

Figure 34:
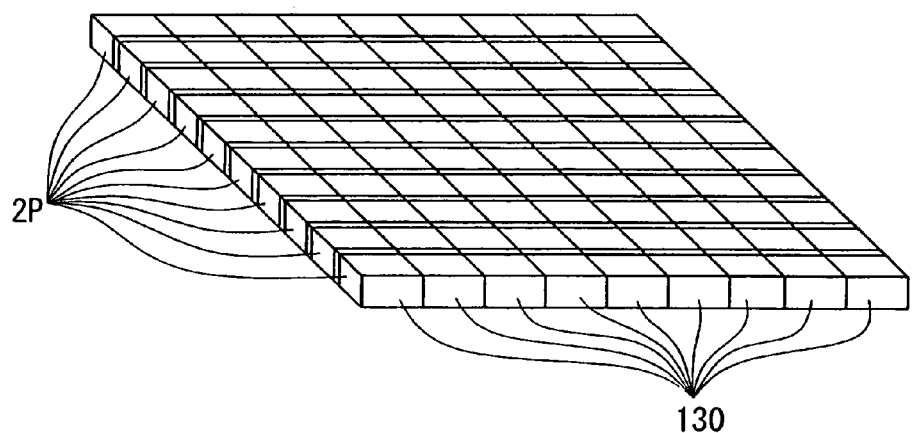
FIG. 34 is a perspective view showing a state in which a plurality of main body aggregates are arranged without any jig bonded to each of the main body aggregates.

Alternatively, a plurality of main body aggregates 130 without the jig 126 bonded thereto may be arranged in the stacking direction of the plurality of layer portions 10 while performing alignment. FIG. 34 shows the plurality of main body aggregates 130 arranged in such a manner. In this case, too, the plurality of main body aggregates 130 thus arranged may be fixed by being bonded to each other such that they are easily separable.

In the case of arranging a plurality of main body aggregates 130 each without the jig 126 bonded thereto, if the portions to become the insulating portion 31 and the terminal layer main body 21 are transparent and consequently at least either the alignment marks 107 or 123 are observable, the position of each main body aggregate 130 may be recognized and controlled by recognizing at least either the alignment marks 107 or 123 through the use of the image recognizer included in the chip bonding apparatus. In this case, the alignment marks are observed in the direction of the arrow 143 in FIG. 32.

Figure 35:
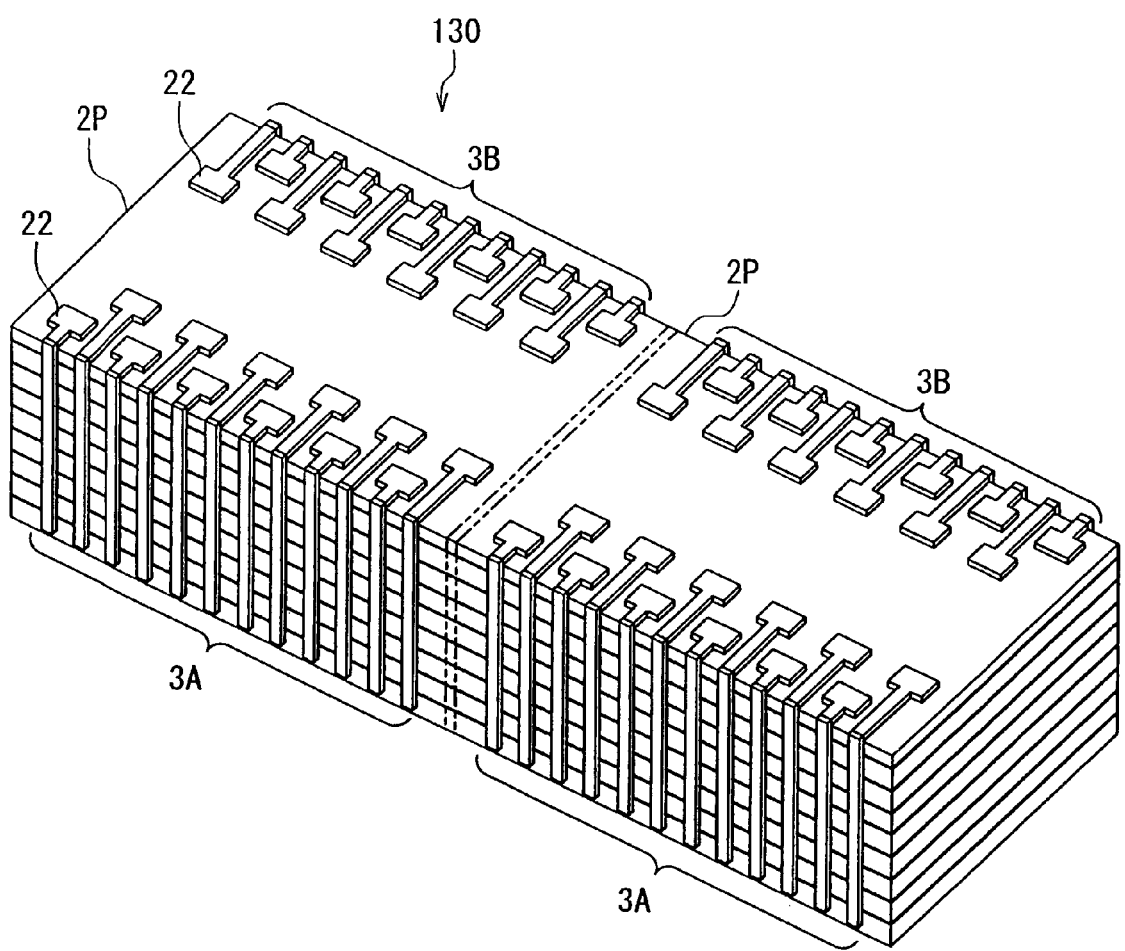
FIG. 35 is a perspective view of a portion of the main body aggregate having undergone the formation of wiring.

Reference is now made to FIG. 35 to describe the step of forming the wiring 3A, 3B. In this step, the wiring 3A, 3B is formed for each of the pre-main-body portions 2P of the main body aggregate 130. The wiring 3A, 3B is formed by frame plating, for example. In this case, first, a seed layer for plating is formed on the side surface of the main body aggregate 130 on which the wiring 3A is to be formed. Next, a frame having grooves is formed on the seed layer. The frame is formed by patterning a photoresist film by photolithography, for example. Next, plating layers to become part of the wiring 3A is formed by plating on the seed layer in the grooves of the frame. Next, the frame is removed and the seed layer except portions thereof located below the plating layers is removed by etching. As a result, the wiring 3A is formed of the plating layers and the portions of the seed layer remaining therebelow. Next, the wiring 3B is formed in the same way as the wiring 3A on the side surface of the main body aggregate 130 on which the wiring 3B is to be formed. FIG. 35 shows a portion of the main body aggregate 130 having undergone the formation of the wiring 3A, 3B.

Figure 36:
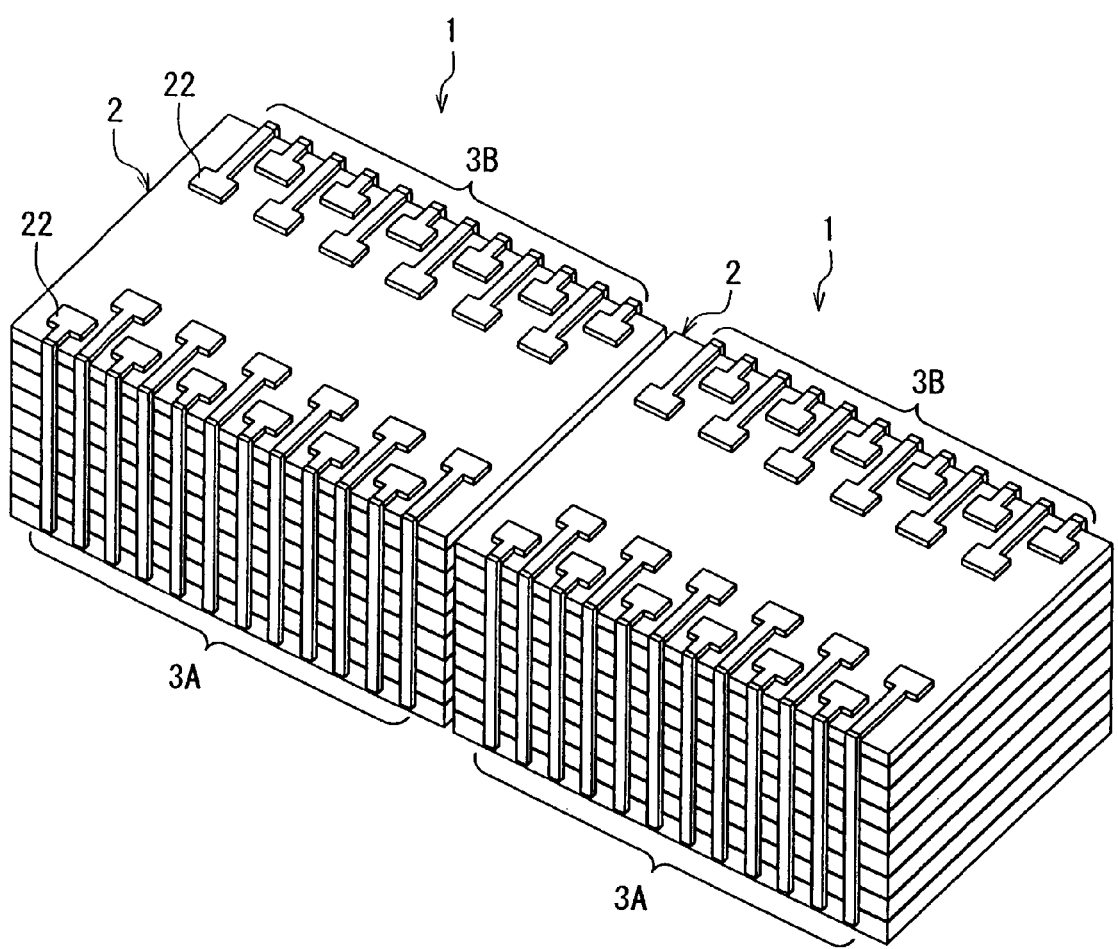
FIG. 36 is a perspective view showing a plurality of layered chip packages formed by cutting the main body aggregate.

Reference is now made to FIG. 36 to describe the step of cutting the main body aggregate 130. In this step, the main body aggregate 130 is cut to separate the plurality of pre-main-body portions 2P included in the main body aggregate 130 from each other so that each of the pre-main-body portions 2P becomes the main body 2 and a plurality of layered chip packages 1 are thereby formed. In this way, as shown in FIG. 36, a plurality of layered chip packages 1 are manufactured at a time.

The layered chip package 1 of the present embodiment can be used as it is as a single electronic component. For example, the layered chip package 1 can be mounted on a wiring board by a flip-chip technique by placing the layered chip package 1 on the wiring board such that the plurality of pad-shaped terminals 22 face downward.

For example, if a device for use with the layered chip package 1 has a recessed portion to accommodate the layered chip package 1, the layered chip package 1 can be inserted to the recessed portion such that the plurality of pad-shaped terminals 22 face upward. It is thereby possible to connect the pad-shaped terminals 22 to circuits in the device.

Figure 37:
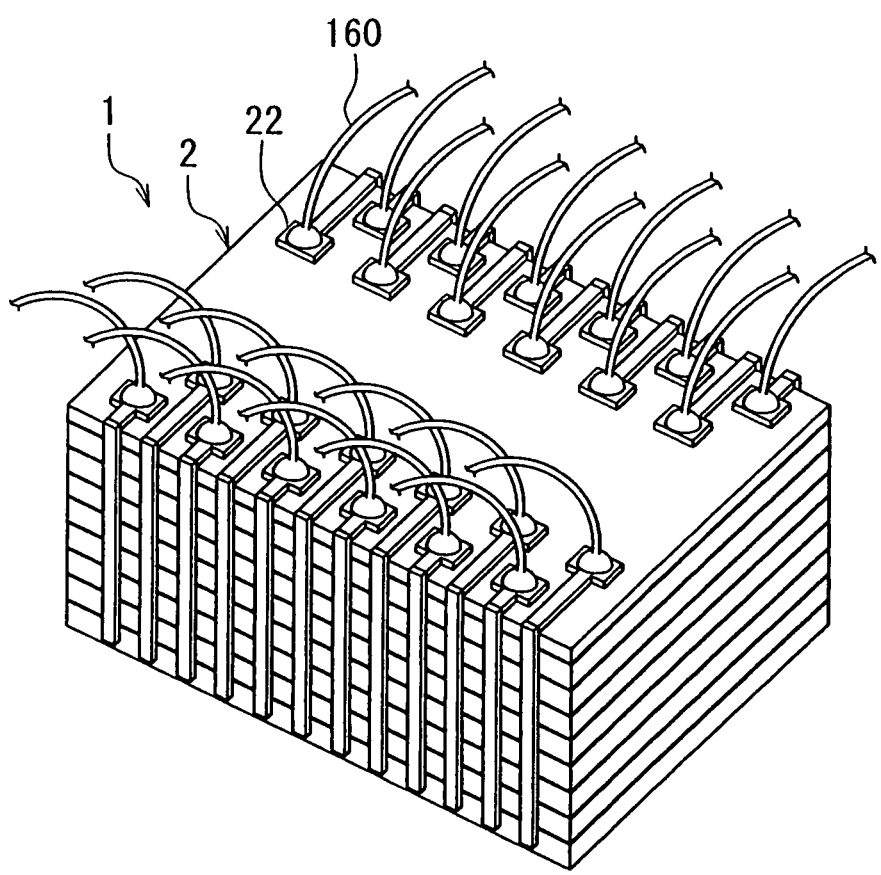
FIG. 37 is a perspective view showing an example of use of the layered chip package of the first embodiment of the invention.

FIG. 37 shows an example of use of the layered chip package 1. In this example, bonding wires 160 are connected at one end to the plurality of pad-shaped terminals 22 of the layered chip package 1. The other end of each of the bonding wires 160 is connected to a terminal of a device for use with the layered chip package 1.

Figure 38:
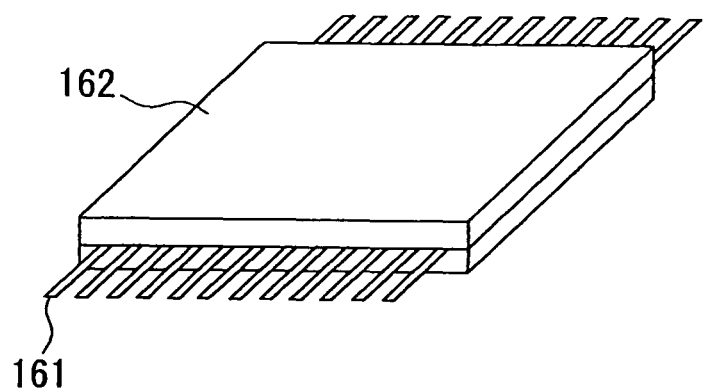
FIG. 38 is a perspective view showing another example of use of the layered chip package of the first embodiment of the invention.
Figure 39:
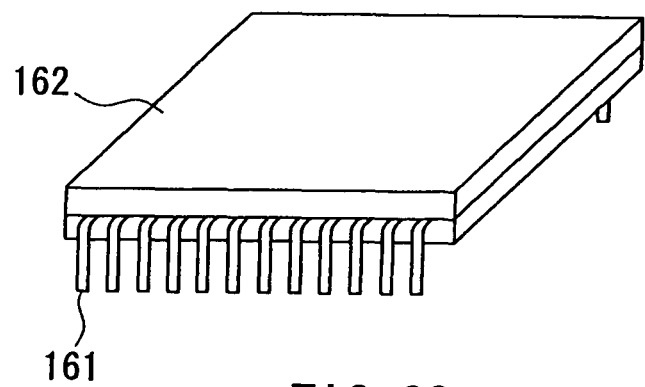
FIG. 39 is a perspective view showing still another example of use of the layered chip package of the first embodiment of the invention.

FIG. 38 and FIG. 39 show other examples of use of the layered chip package 1. In each of these examples, the layered chip package 1 is mounted to a lead frame having a plurality of pins 161 and is sealed with a molded resin. The plurality of pad-shaped terminals 22 of the layered chip package 1 are connected to the plurality of pins 161. The molded resin forms a protection layer 162 for protecting the layered chip package 1. FIG. 38 shows an example in which the plurality of pins 161 extend horizontally. FIG. 39 shows an example in which the plurality of pins 161 are folded downward.

As described so far, according to the present embodiment, it is possible to provide a layered chip package 1 that includes a plurality of chips 30 stacked and that is capable of achieving higher integration. The layered chip package 1 of the present embodiment includes a main body 2 having a top surface, a bottom surface and four side surfaces, and wiring 3 disposed on at least one of the side surfaces of the main body 2. The main body 2 includes a plurality of layer portions 10 stacked. The plurality of layer portions 10 include at least one layer portion 10 of a first type and at least one layer portion 10 of a second type. The at least one layer portion 10 of the first type and the at least one layer portion 10 of the second type each include a semiconductor chip 30, and an insulating portion 31 covering at least one of four side surfaces of the semiconductor chip 30. The insulating portion 31 has at least one end face 31a located at the at least one of the side surfaces of the main body 2 on which the wiring 3 is disposed.

The semiconductor chip 30 of the at least one layer portion 10 of the first type is a non-defective one whereas the semiconductor chip 30 of the at least one layer portion 10 of the second type is a defective one. The at least one layer portion 10 of the first type further includes a plurality of electrodes 32 each connected to the semiconductor chip 30 and each having an end face 32a located at the at least one of the side surfaces of the main body 2 on which the wiring 3 is disposed, whereas the at least one layer portion 10 of the second type does not include any electrode connected to the semiconductor chip 30 and having an end face located at the at least one of the side surfaces of the main body 2 on which the wiring 3 is disposed. The end face 32a of each of the plurality of electrodes 32 is surrounded by the insulating portion 31. The wiring 3 is connected to the end face 32a of each of the plurality of electrodes 32.

The manufacturing method for the layered chip package 1 of the present embodiment includes the steps of: fabricating a plurality of substructures 110 that respectively correspond to the plurality of layer portions 10 of the layered chip package 1, each substructure 110 including a plurality of its corresponding layer portions 10 and being intended to be cut later at a boundary between every adjacent ones of the plurality of its corresponding layer portions 10; and completing the layered chip package 1 by fabricating the main body 2 using the plurality of substructures 110 and by forming the wiring 3 on the main body 2.

The step of fabricating the plurality of substructures 110 includes, as a series of steps for fabricating each substructure 110, the step of fabricating a pre-substructure wafer 101 including a plurality of pre-semiconductor-chip portions 30P aligned, the step of distinguishing between a normally functioning pre-semiconductor-chip portion 30P and a malfunctioning pre-semiconductor-chip portion 30P among the plurality of pre-semiconductor-chip portions 30P included in the pre-substructure wafer 101, and the step of forming the plurality of electrodes 32 so as to be connected to the normally functioning pre-semiconductor-chip portion 30P, without forming any electrode connected to the malfunctioning pre-semiconductor-chip portion 30P and having an end face located at the at least one of the side surfaces of the main body 2 on which the wiring 3 is disposed.

According to the layered chip package 1 of the present embodiment, a layer portion 10 of the second type, which includes a defective semiconductor chip 30, is not provided with any electrode connected to the semiconductor chip 30 and having an end face located at the at least one of the side surfaces of the main body 2 on which the wiring 3 is disposed. The use of the defective semiconductor chip 30 is thus disabled.

If a layer portion 10 including a defective semiconductor chip 30 is provided with an electrode connected to the semiconductor chip 30 and having an end face located at the at least one of the side surfaces of the main body 2 on which the wiring 3 is disposed, the electrode will be connected to the wiring 3. In this case, the electrode connected to the defective semiconductor chip 30 generates a capacitance or inductance that is unwanted for a device formed using the layered chip package 1, such as a memory device, and/or generates a stray capacitance between itself and an electrode 32 connected to a non-defective semiconductor chip 30. This is a hindrance to increasing the operation speed of the device such as the memory device.

In contrast, according to the present embodiment, as described above, the layer portion 10 of the second type including a defective semiconductor chip 30 is not provided with any electrode connected to the semiconductor chip 30 and having an end face located at the at least one of the side surfaces of the main body 2 on which the wiring 3 is disposed. Therefore, in the layered chip package 1, the layer portion 10 of the second type including a defective semiconductor chip 30 can be regarded as merely an insulating layer. The present embodiment thus makes it possible to disable the use of a defective semiconductor chip 30 while reducing problems attributable to wiring connected to the defective semiconductor chip 30.

In a case where the layered chip package 1 includes a plurality of semiconductor chips 30 serving as memory chips and where one or more, but not all, of the semiconductor chips 30 are defective, the layered chip package 1 will have a smaller memory capacity compared with a case where all of the semiconductor chips 30 are non-defective, but the package 1 in this case is commercially viable as a product having a small memory capacity. The memory capacity of the layered chip package 1 varies depending on the number of defective semiconductor chips 30 included therein. If a plurality of layered chip packages 1 are classified according to memory capacity, it is possible to provide a plurality of types of products having different memory capacities.

If the layered chip package 1 includes a minimum number of semiconductor chips 30, an occurrence of a defective semiconductor chip 30 can make the memory capacity of the layered chip package 1 smaller than desired. To cope with this, the layered chip package 1 may be configured to include a larger number of semiconductor chips 30 than a minimum number to provide redundancy. The level of redundancy to be provided for the layered chip package 1 can be appropriately determined according to the rate of occurrences of defective semiconductor chip 30, for example.

The manufacturing method for the layered chip package 1 of the present embodiment can provide not only a layered chip package 1 including one or more non-defective semiconductor chips 30 and one or more defective semiconductor chips 30 but also a layered chip package 1 including non-defective semiconductor chips 30 only, and a layered chip package 1 including defective semiconductor chips 30 only. Needless to say, the layered chip package 1 including non-defective semiconductor chips 30 only is commercial viable. The layered chip package 1 including defective semiconductor chips 30 only may simply be discarded.

According to the present embodiment, the plurality of semiconductor chips 30 stacked are electrically connected through the wiring 3 disposed on at least one of the side surfaces of the main body 2. Consequently, the present embodiment is free from the problems of the wire bonding method, that is, the problem that it is difficult to reduce the distance between electrodes so as to avoid contact between wires, and the problem that high resistances of the wires hamper a high-speed operation of a circuit.

Compared with the through electrode method, the present embodiment has the following advantages. First, the present embodiment does not require formation of through electrodes in each chip and consequently does not require a large number of steps for forming through electrodes in each chip.

According to the present embodiment, electrical connection between the plurality of semiconductor chips 30 is established through the wiring 3 disposed on at least one of the side surfaces of the main body 2. The present embodiment thus provides higher reliability of electrical connection between chips as compared with the case of using through electrodes to establish electrical connection between chips.

Furthermore, according to the present embodiment, it is possible to easily change the line width and thickness of the wiring 3. Consequently, it is possible to respond to future demands for finer wiring 3.

The through electrode method requires that the through electrodes of upper and lower chips be connected to each other by means of, for example, soldering at high temperatures. In contrast, according to the present embodiment, it is possible to form the wiring 3 at lower temperatures because the wiring 3 can be formed by plating. According to the present embodiment, it is also possible to perform bonding of the plurality of layer portions 10 at low temperatures. Consequently, it is possible to prevent the chips 30 from suffering damage from heat.

The through electrode method further requires that upper and lower chips be accurately aligned for connecting the through electrodes of the upper and lower chips to each other. In contrast, according to the present embodiment, electrical connection between the semiconductor chips 30 is performed not at an interface between every vertically adjacent two of the layer portions 10 but through the use of the wiring 3 disposed on at least one of the side surfaces of the main body 2. The accuracy required for alignment of the plurality of layer portions 10 is therefore lower than that required for alignment of a plurality of chips in the through electrode method.

The manufacturing method for the layered chip package of the present embodiment allows a reduction in the number of steps and consequently allows a reduction in cost for the layered chip package, compared with the manufacturing method for a layered chip package disclosed in U.S. Pat. No. 5,953,588.

From the foregoing, the present embodiment makes it possible to mass-produce the layered chip package 1 at low cost in a short period of time.

According to the manufacturing method for the layered chip package 1 of the present embodiment, it is possible to easily reduce the thicknesses of the plurality of substructures 110 to constitute the layered substructure 115 while preventing damage to the substructures 110. This allows a high-yield manufacture of the layered chip package 1 that achieves a reduction in size and a high level of integration.

In the present embodiment, the method of fabricating the layered substructure 115 is not limited to the method described with reference to FIG. 5 to FIG. 27. For example, the layered substructure 115 may be fabricated by the following method. First, the first pre-polishing substructure 109 is bonded to a jig such that the first surface 109a of the first pre-polishing substructure 109 faces the jig. Next, the second surface 109b of the first pre-polishing substructure 109 bonded to the jig is polished so that the first pre-polishing substructure 109 is thinned by the polishing and thereby the first substructure 110 is formed in the state of being bonded to the jig. Next, the second pre-polishing substructure 109 is bonded to the first substructure 110 such that the first surface 109a of the second pre-polishing substructure 109 faces the polished surface of the first substructure 110. Next, the second surface 109b of the second pre-polishing substructure 109 is polished so that the second pre-polishing substructure 109 is thinned by the polishing and thereby the second substructure 110 is formed in the state of being stacked on the first substructure 110. As necessary, one or more substructures 110 are further stacked on the second substructure 110 by the same method as the method of forming the second substructure 110, and the layered substructure 115 is thereby fabricated.

Alternatively, the layered substructure 115 can be fabricated through: forming a stack of two substructures 110 by bonding the two substructures 110 to each other such that their respective second surfaces 110b face toward each other; and stacking a plurality of such stacks.

Second Embodiment

A manufacturing method for the layered chip package 1 of a second embodiment of the invention will now be described.

The manufacturing method for the layered chip package 1 of the second embodiment is different from the method of the first embodiment only in the step of forming the frame 108. First, in the second embodiment, the photoresist layer for forming the frame 108 is positive-working.

The exposure step of exposing the photoresist layer for forming the frame 108 of the second embodiment will now be described with reference to the flow chart of FIG. 40. In the exposure step of the second embodiment, as in the first embodiment, the photoresist layer is exposed such that a latent image corresponding to the plurality of electrodes 32 is formed on a portion of the photoresist layer corresponding to a normally functioning pre-semiconductor-chip portion 30P whereas any latent image corresponding to an electrode connected to a malfunctioning pre-semiconductor-chip portion 30P and having an end face located at the at least one of the side surfaces of the main body 2 on which the wiring 3 is disposed is not formed on a portion of the photoresist layer corresponding to the malfunctioning pre-semiconductor-chip portion 30P. In this exposure step, first, among of the plurality of the pattern projection regions that correspond to the plurality of pre-semiconductor-chip portions 30P, a pattern projection region that corresponds to a first pre-semiconductor-chip portion 30P is selected to be exposed by the exposure apparatus of FIG. 14 (Step S201). Next, the control device 250 judges whether the pre-semiconductor-chip portion 30P corresponding to the selected pattern projection region is a normally functioning one or not (Step S202).

If the pre-semiconductor-chip portion 30P is judged as a normally functioning one (Y) in Step S202, the portion of the photoresist layer corresponding to the normally functioning pre-semiconductor-chip portion 30P is exposed in an electrode pattern corresponding to the plurality of electrodes 32 through a mask 201 having the electrode pattern (Step S203). Specifically, the electrode pattern of the second embodiment is configured to allow light to be applied to the area of the pattern projection region where to form the grooves 108a to later accommodate the electrodes 32 and to disallow light to be applied to the remaining area of the pattern projection region. As a result of this exposure, a latent image corresponding to the plurality of electrodes 32 is formed on the portion of the photoresist layer corresponding to the normally functioning pre-semiconductor-chip portion 30P. To be more specific, in the portion of the photoresist layer corresponding to a normally functioning pre-semiconductor-chip portion 30P, the area where to form the grooves 108a to later accommodate the electrodes 32 becomes soluble in the developing solution upon this exposure, while the remaining area remains insoluble in the developing solution.

If the pre-semiconductor-chip portion 30P is judged as a malfunctioning one (N) in Step S202, the portion of the photoresist layer corresponding to the malfunctioning pre-semiconductor-chip portion 30P is not subjected to any exposure (Step S204). As a result, any latent image corresponding to an electrode connected to the malfunctioning pre-semiconductor-chip portion 30P and having an end face located at the at least one of the side surfaces of the main body 2 on which the wiring 3 is disposed is not formed on the portion of the photoresist layer corresponding to the malfunctioning pre-semiconductor-chip portion 30P. Specifically, the entire portion of the photoresist layer corresponding to the malfunctioning pre-semiconductor-chip portion 30P remains insoluble in the developing solution. In the case where the layer portion 10 of the second type includes an electrode or wiring other than one connected to the malfunctioning semiconductor chip 30 and having an end face located at the at least one of the side surfaces of the main body 2 on which the wiring 3 is disposed, an exposure is performed in Step S204 such that a latent image corresponding to such an electrode or wiring is formed, instead of no exposure. In this case also, any latent image corresponding to an electrode connected to the malfunctioning pre-semiconductor-chip portion 30P and having an end face located at the at least one of the side surfaces of the main body 2 on which the wiring 3 is disposed is not formed on the portion of the photoresist layer corresponding to the malfunctioning pre-semiconductor-chip portion 30P.

After the Step S203 or S204 is performed, the control device 250 judges whether the pattern projection region having undergone the Step S203 or S204 is the region corresponding to the last pre-semiconductor-chip portion 30P (Step S205). If the pattern projection region is judged as corresponding to the last pre-semiconductor-chip portion 30P (Y), the exposure step is finished. If the pattern projection region is judged as not corresponding to the last pre-semiconductor-chip portion 30P (N), a pattern projection region corresponding to a next pre-semiconductor-chip portion 30P is selected to be exposed (Step S206) and the process starting from Step S202 is repeated.

Figure 40:
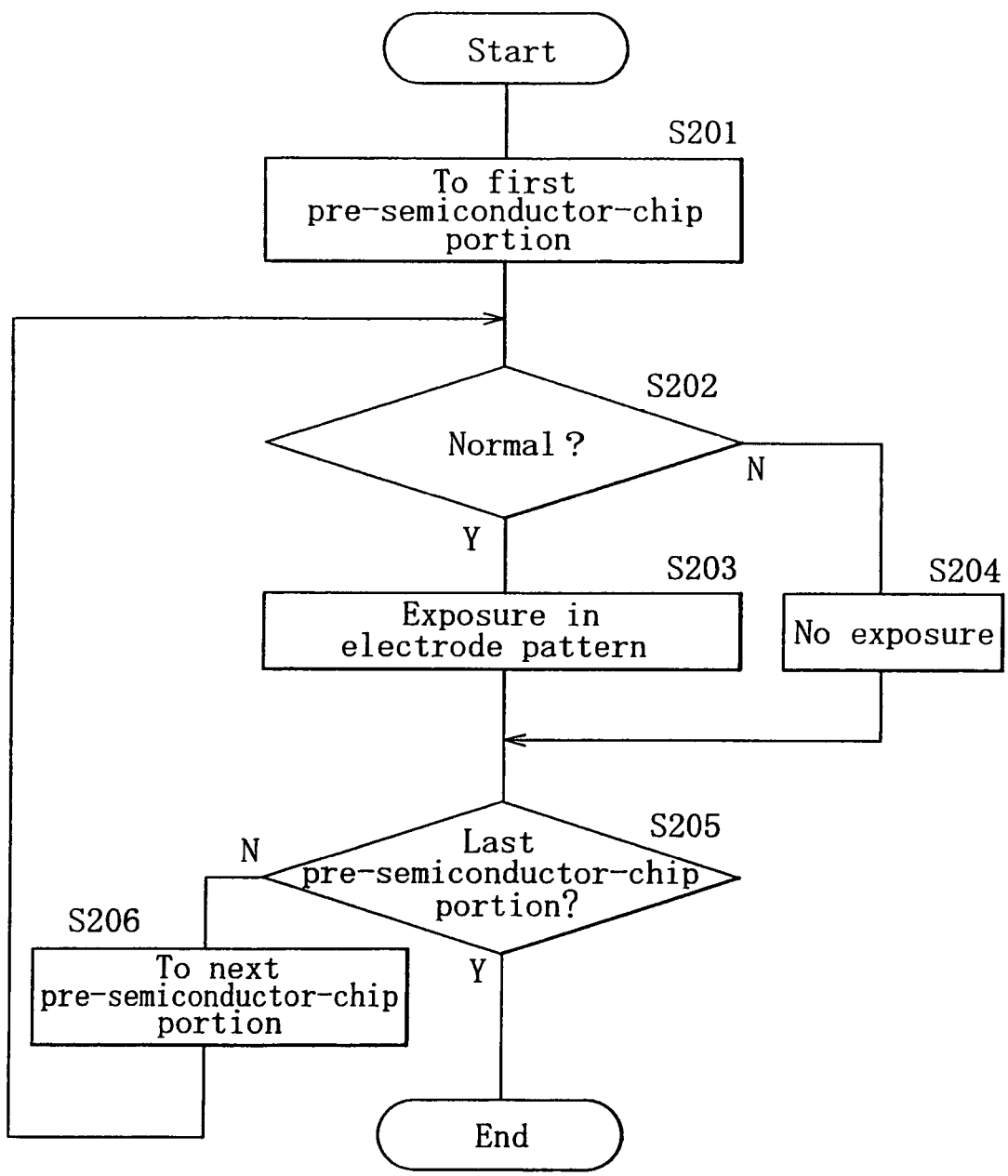
FIG. 40 is a flow chart showing an exposure step for forming a plurality of electrodes in a manufacturing method for a layered chip package of a second embodiment of the invention.
Figure 41:
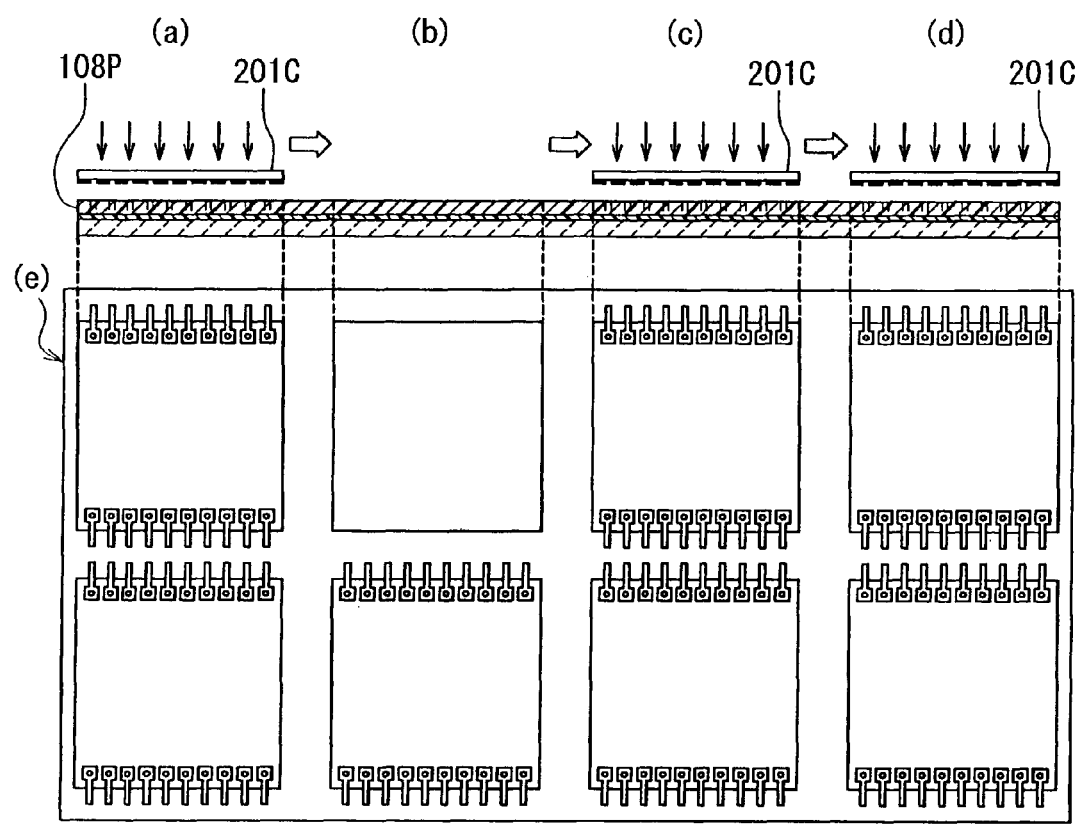
FIG. 41 is an illustrative view showing the exposure step for forming the plurality of electrodes in the manufacturing method for the layered chip package of the second embodiment of the invention.

FIG. 41 is an illustrative view showing the exposure step of FIG. 40. Reference sign 108P in FIG. 41 indicates the photoresist layer to be used for forming the frame 108. Portions (a), (b), (c) and (d) of FIG. 41 indicate regions for which Step S203 or S204 is to be performed. In the example of FIG. 41, Step S203 or S204 is performed in the order of the regions (a), (b), (c) and (d). For the regions (a), (c) and (d), the corresponding pre-semiconductor-chip portions 30P have been judged as normally functioning ones in Step S202 and consequently the portions of the photoresist layer 108P corresponding to those normally functioning pre-semiconductor-chip portions 30P are each exposed in the electrode pattern through a mask 201C having the electrode pattern. For the region (b), the corresponding pre-semiconductor-chip portion 30P has been judged as a malfunctioning one in Step S202 and consequently the portion of the photoresist layer 108P corresponding to the malfunctioning pre-semiconductor-chip portion 30P is not subjected to any exposure. The portion (e) of FIG. 41 shows the plane geometry of the latent image formed on the photoresist layer 108P by exposure 152 After the exposure step described above, the photoresist layer 108P is developed with a developing solution and the frame 108 is thereby formed. The shape of the frame 108 is the same as that of the first embodiment.

The remainder of configuration, function and effects of the second embodiment are similar to those of the first embodiment.

Third Embodiment

A manufacturing method for the layered chip package 1 of a third embodiment of the invention will now be described. The manufacturing method for the layered chip package 1 of the third embodiment is different from the method of the first embodiment only in the step of forming the frame 108. First, in the third embodiment, the photoresist layer for forming the frame 108 is negative-working.

In the third embodiment, the step of forming the frame 108 includes: a first exposure step of exposing all of the plurality of portions of the photoresist layer corresponding to the plurality of pre-semiconductor chip portions 30P, that is, all of the pattern projection regions, in the electrode pattern corresponding to the plurality of electrodes 32; a second exposure step of subjecting only a portion of the photoresist layer corresponding to a malfunctioning pre-semiconductor-chip portion 30P to an overall exposure before or after the first exposure step; and a step of developing the photoresist layer after the first and second exposure steps.

Figure 42:
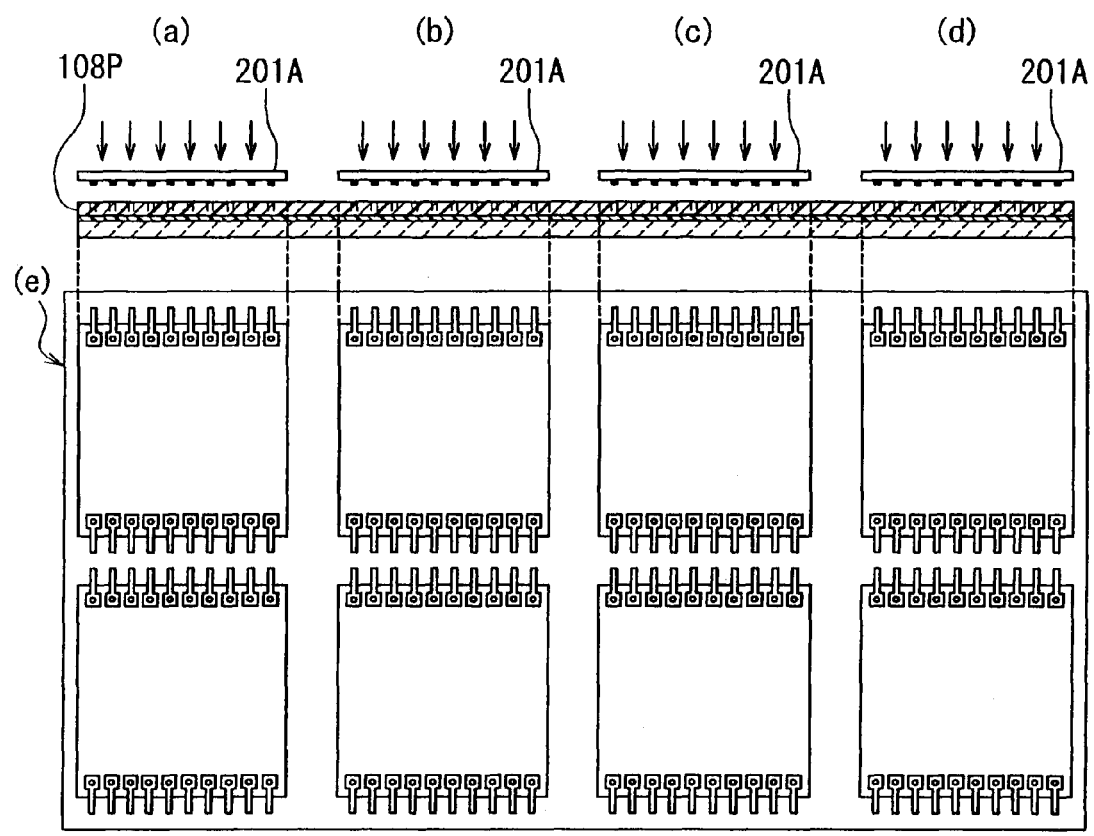
FIG. 42 is an illustrative view showing a first exposure step for forming a plurality of electrodes in a manufacturing method for a layered chip package of a third embodiment of the invention.
Figure 43:
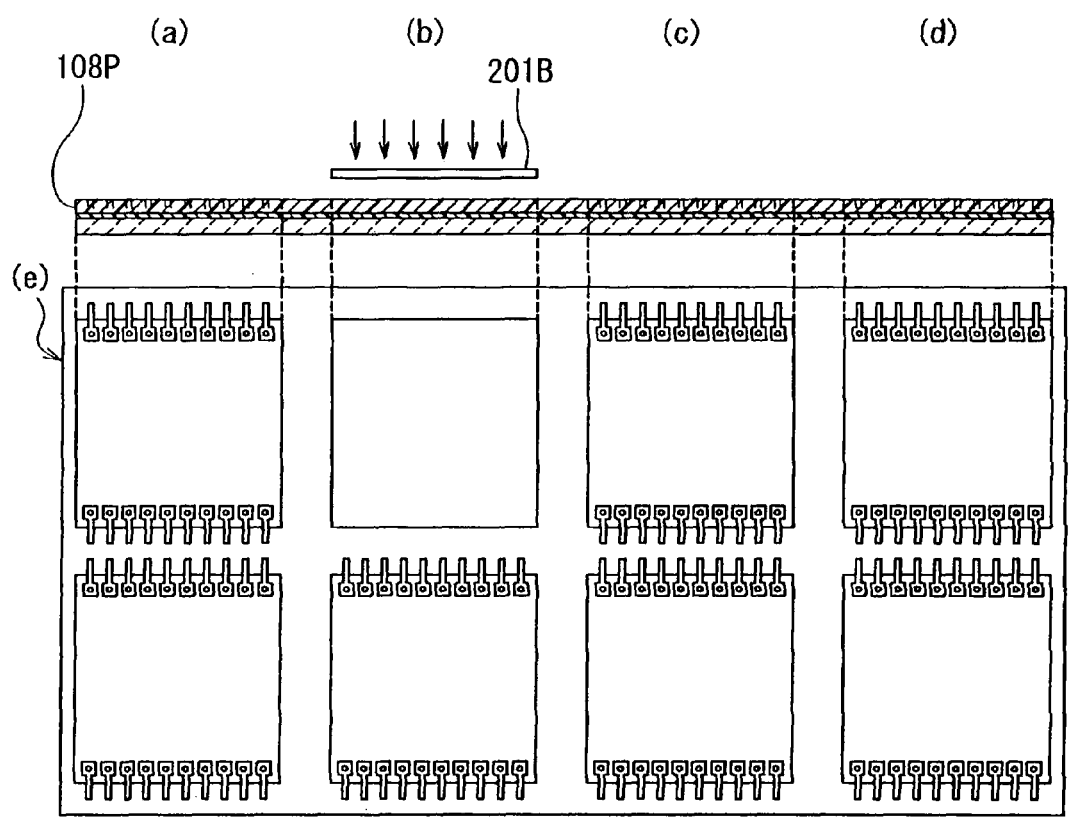
FIG. 43 is an illustrative view showing a second exposure step for forming the plurality of electrodes in the manufacturing method for the layered chip package of the third embodiment of the invention.

Reference is now made to FIG. 42 and FIG. 43 to describe the case of performing the second exposure step after the first exposure step. FIG. 42 is an illustrative view showing the first exposure step. FIG. 43 is an illustrative view showing the second exposure step. In FIG. 42 and FIG. 43 reference sign 108P indicates the photoresist layer to be used for forming the frame 108.

Portions (a), (b), (c) and (d) of FIG. 42 indicate regions to undergo exposure in the electrode pattern in the first exposure step. In the first exposure step, all of the plurality of portions of the photoresist layer 108P corresponding to the plurality of pre-semiconductor chip portions 30P are exposed in the electrode pattern through the mask 201A having the electrode pattern. As a result, a latent image of the electrode pattern is formed on all of the plurality of portions of the photoresist layer 108P corresponding to the plurality of pre-semiconductor chip portions 30P. The portion (e) of FIG. 42 shows the plane geometry of the latent image formed on the photoresist layer 108P by exposure.

Regions (a), (b), (c) and (d) of FIG. 43 correspond to the regions (a), (b), (c) and (d) of FIG. 42. In the example of FIG. 43, the pre-semiconductor-chip portions 30P in the regions (a), (c) and (d) are normally functioning ones whereas the pre-semiconductor-chip portion 30P in the region (b) is a malfunctioning one. In the second exposure step, the portion of the photoresist layer 108P corresponding to the malfunctioning pre-semiconductor-chip portion 30P in the region (b) is subjected to an overall exposure. The portion (e) of FIG. 43 shows the plane geometry of the latent image formed on the photoresist layer 108P by exposure.

In the region (b), although the latent image is formed by the first exposure step as shown in FIG. 42, it disappears by the overall exposure performed in the second exposure step. As a result, the entire portion of the photoresist layer 108P corresponding to the malfunctioning pre-semiconductor-chip portion 30P becomes insoluble in the developing solution.

After the first and second exposure steps, the photoresist layer 108P is developed with the developing solution and the frame 108 is thereby formed. The shape of the frame 108 is the same as that of the first embodiment.

In the third embodiment, the first exposure step may be performed after the second exposure step. In this case, first, by performing the second exposure step, an entire portion of the photoresist layer 108P corresponding to a malfunctioning pre-semiconductor-chip portion 30P becomes insoluble in the developing solution. Then, by performing the first exposure step, a latent image of the electrode pattern is formed on a portion of the photoresist layer 108P corresponding to a normally functioning pre-semiconductor chip portion 30P. At this time, although the portion of the photoresist layer corresponding to the malfunctioning pre-semiconductor-chip portion 30P is also exposed, the whole of this portion has already become insoluble in the developing solution through the overall exposure. There is no difference in the resulting frame 108 between the case where the first exposure step is performed after the second exposure step and the case where the second exposure step is performed after the first exposure step.

According to the third embodiment, since there is no need to replace the mask 201 during each of the first exposure step and the second exposure step, each of the first and second exposure steps can be completed in a short period of time. In the first exposure step, in particular, since all of the pattern projection regions are to be exposed in the same electrode pattern, two or more, such as four to six, of the pattern projection regions can be simultaneously exposed using a stepper. In the first exposure step, for example, use of a contact aligner or a projection aligner in place of the stepper allows exposing all of the pattern projection regions simultaneously. Exposing a plurality of pattern projection regions simultaneously in the first exposure step as described above reduces the time required for the first exposure step. From the foregoing, compared with the first and second embodiments, the third embodiment serves to shorten the time required for the process of exposing the photoresist layer 108P for forming the frame 108, and thereby serves to increase productivity.

The remainder of configuration, function and effects of the third embodiment are similar to those of the first embodiment.

The present invention is not limited to the foregoing embodiments but can be carried out in various modifications. For example, while in the foregoing embodiments a plurality of main body aggregates 130 are arranged and then the wiring 3 is formed for the pre-main-body portions 2P of the plurality of main body aggregates 130 at a time, the wiring 3 may be formed for the pre-main-body portions 2P of a single main body aggregate 130 without arranging a plurality of main body aggregates 130.

In addition, after the main body 2 is formed by cutting the main body aggregate 130 having undergone the formation of the wiring 3, another wiring may be formed on a surface formed for the main body 2 as a result of cutting the main body aggregate 130.

In addition, the terminal layer 20 may be eliminated from the main body 2 of the layered chip package 1 and part of the wiring 3 may also function as external connecting terminals.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A method of manufacturing a layered chip package, the layered chip package comprising:
    a main body having a top surface, a bottom surface and four side surfaces; and
    wiring disposed on at least one of the side surfaces of the main body, wherein:
    the main body includes a plurality of layer portions stacked;
    each of the plurality of layer portions includes a semiconductor chip;
    at least one of the plurality of layer portions further includes a plurality of electrodes each connected to the semiconductor chip and each having an end face located at the at least one of the side surfaces of the main body on which the wiring is disposed; and
    the wiring is connected to the end face of each of the plurality of electrodes,
    the method comprising the steps of:
    fabricating a plurality of substructures that respectively correspond to the plurality of layer portions of the layered chip package, each substructure including a plurality of its corresponding layer portions and being intended to be cut later at a boundary between every adjacent ones of the plurality of its corresponding layer portions; and
    completing the layered chip package by fabricating the main body using the plurality of substructures and by forming the wiring on the main body, wherein the step of fabricating the plurality of substructures includes, as a series of steps for fabricating each substructure, the step of fabricating a pre-substructure wafer by performing processing on a first surface of a semiconductor wafer having the first surface and a second surface that face toward opposite directions, the pre-substructure wafer having a first surface and a second surface that respectively correspond to the first surface and the second surface of the semiconductor wafer and including a plurality of pre-semiconductor-chip portions aligned;

the step of distinguishing between a non-malfunctioning pre-semiconductor-chip portion and a malfunctioning pre-semiconductor-chip portion among the plurality of pre-semiconductor-chip portions included in the pre-substructure wafer; and the step of forming the plurality of electrodes so as to be connected to the non-malfunctioning pre-semiconductor-chip portion, without forming any electrode connected to the malfunctioning pre-semiconductor-chip portion and having an end face located at the at least one of the side surfaces of the main body on which the wiring is disposed.

2. The method of manufacturing the layered chip package according to claim 1, wherein:

each of the plurality of layer portions further includes an insulating portion covering at least one of four side surfaces of the semiconductor chip;

the insulating portion has at least one end face located at the at least one of the side surfaces of the main body on which the wiring is disposed; and the end face of each of the plurality of electrodes is surrounded by the insulating portion.

3. The method of manufacturing the layered chip package according to claim 2, wherein:

the step of fabricating the plurality of substructures further includes, between the step of fabricating the pre-substructure wafer and the step of forming the plurality of electrodes in the series of steps for fabricating each substructure, the step of forming at least one groove in the pre-substructure wafer, the at least one groove opening at the first surface of the pre-substructure wafer and extending to be adjacent to at least one of the pre-semiconductor-chip portions, and the step of forming an insulating layer to fill the at least one groove, the insulating layer being intended to become part of the insulating portion later, and wherein:

in the step of forming the plurality of electrodes, the plurality of electrodes are formed such that part of each of the electrodes lies on the insulating layer; and in the step of completing the layered chip package, the insulating layer is cut to form a cut surface along a direction in which the at least one groove extends, whereby part of the at least one end face of the insulating portion is formed by the cut surface of the insulating layer and the end face of each of the plurality of electrodes is exposed.

4. The method of manufacturing the layered chip package according to claim 1, wherein the step of completing the layered chip package includes the steps of:

fabricating a layered substructure by stacking the plurality of substructures in correspondence with the order of stacking of the plurality of layer portions of the layered chip package;

forming a main body aggregate by cutting the layered substructure, the main body aggregate including a plurality of pre-main-body portions each of which will later become the main body, the plurality of pre-main-body portions being aligned in one direction that is orthogonal to the stacking direction of the plurality of layer portions;

forming the wiring for each of the pre-main-body portions of the main body aggregate; and cutting the main body aggregate after the formation of the wiring so as to separate the plurality of pre-main-body portions from each other so that each of them becomes the main body and a plurality of layered chip packages are thereby formed.

5. The method of manufacturing the layered chip package according to claim 1, wherein the step of forming the plurality of electrodes includes the steps of:

forming a photoresist layer for use for forming the plurality of electrodes, the photoresist layer including a plurality of portions that respectively correspond to all of the pre-semiconductor-chip portions;

forming a frame by patterning the photoresist layer by photolithography, the frame having a plurality of grooves to later accommodate the plurality of electrodes; and forming the plurality of electrodes in the grooves of the frame.

6. The method of manufacturing the layered chip package according to claim 5, wherein, in the step of forming the plurality of electrodes in the grooves of the frame, the plurality of electrodes are formed by plating.

7. The method of manufacturing the layered chip package according to claim 5, wherein the step of forming the frame includes:

an exposure step of exposing the photoresist layer such that a latent image corresponding to the plurality of electrodes is formed on a portion of the photoresist layer corresponding to the non-malfunctioning pre-semiconductor-chip portion whereas any latent image corresponding to an electrode connected to the malfunctioning pre-semiconductor-chip portion and having an end face located at the at least one of the side surfaces of the main body on which the wiring is disposed is not formed on a portion of the photoresist layer corresponding to the malfunctioning pre-semiconductor-chip portion; and a step of developing the photoresist layer after the exposure step.

8. The method of manufacturing the layered chip package according to claim 5, wherein the photoresist layer is negative-working, and the step of forming the frame includes:

an exposure step in which a portion of the photoresist layer corresponding to the non-malfunctioning pre-semiconductor-chip portion is exposed in a pattern corresponding to the plurality of electrodes whereas a portion of the photoresist layer corresponding to the malfunctioning pre-semiconductor-chip portion is subjected to an overall exposure; and a step of developing the photoresist layer after the exposure step.

9. The method of manufacturing the layered chip package according to claim 5, wherein the photoresist layer is positive-working, and the step of forming the frame includes:

an exposure step in which a portion of the photoresist layer corresponding to the non-malfunctioning pre-semiconductor-chip portion is exposed in a pattern corresponding to the plurality of electrodes whereas a portion of the photoresist layer corresponding to the malfunctioning pre-semiconductor-chip portion is not subjected to any exposure; and a step of developing the photoresist layer after the exposure step.

10. The method of manufacturing the layered chip package according to claim 5, wherein the photoresist layer is negative-working, and the step of forming the frame includes:
- a first exposure step of exposing all of the plurality of portions of the photoresist layer in a pattern corresponding to the plurality of electrodes;
- a second exposure step of subjecting only a portion of the photoresist layer corresponding to the malfunctioning pre-semiconductor-chip portion to an overall exposure before or after the first exposure step; and
- a step of developing the photoresist layer after the first and second exposure steps.

* * * * *